United States Patent
Kobayashi

(10) Patent No.: US 7,157,383 B2
(45) Date of Patent: Jan. 2, 2007

(54) METHOD FOR FORMING SILICON DIOXIDE FILM ON SILICON SUBSTRATE, METHOD FOR FORMING OXIDE FILM ON SEMICONDUCTOR SUBSTRATE, AND METHOD FOR PRODUCING SEMICONDUCTOR DEVICE

(75) Inventor: Hikaru Kobayashi, Kyoto (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 10/515,501

(22) PCT Filed: May 21, 2003

(86) PCT No.: PCT/JP03/06348

§ 371 (c)(1), (2), (4) Date: Nov. 24, 2004

(87) PCT Pub. No.: WO03/100844

PCT Pub. Date: Dec. 4, 2003

(65) Prior Publication Data

US 2005/0215070 A1 Sep. 29, 2005

(30) Foreign Application Priority Data

May 24, 2002 (JP) .............................. 2002-151521
Jan. 30, 2003 (JP) .............................. 2003-022803

(51) Int. Cl.
- H01L 21/469 (2006.01)
- H01L 21/44 (2006.01)
- H01L 21/28 (2006.01)
- H01L 21/4763 (2006.01)

(52) U.S. Cl. ...................... 438/762; 438/770; 438/761; 438/650; 438/580; 438/579; 257/E21.082

(58) Field of Classification Search ................ 438/770, 438/761–2, 579, 580, 650, 762
See application file for complete search history.

(56) References Cited

U.S. PATENT DOCUMENTS 3,668,095 A * 6/1972 Katto et al. ................. 204/164
6,221,788 B1 * 4/2001 Kobayashi et al. ......... 438/762

FOREIGN PATENT DOCUMENTS

| EP | 0 757 379 B1 | 6/2003 |
| JP | 43-4291 | 2/1943 |

(Continued)

*Primary Examiner*—Michael Lebentritt
*Assistant Examiner*—Mohsen Ahmadi
(74) *Attorney, Agent, or Firm*—Harness, Dickey & Pierce, P.L.C.

(57) ABSTRACT

After cleaning a surface of a silicon substrate (1), impurities and natural oxide film existing on the silicon substrate (1) are removed by soaking the silicon substrate (1) in a 0.5%-by-volume HF aqueous solution for 5 minutes. The silicon substrate (1) is rinsed (cleaned) with ultrapure water for five minutes. Then, the silicon substrate (1) is soaked for 30 minutes in azeotropic nitric acid heated to an azeotropic temperature of 120.7° C. In this way, an extremely thin chemical oxide film (5) is formed on the surface of the silicon substrate (1). Subsequently, a metal film (6) (aluminum-silicon alloy film) is deposited, followed by heating in a hydrogen-containing gas at 200° C. for 20 minutes. Through the heat processing in the hydrogen-containing gas, hydrogen reacts with interface states and defect states in the chemical oxide film (5), causing disappearance of the interface states and defect states. As a result, the quality of the film can be improved. Thus, it is possible to form a high quality (with low leak current density), extremely thin silicon dioxide film on the silicon substrate at a low temperature with excellent film-thickness controllability.

20 Claims, 14 Drawing Sheets

FOREIGN PATENT DOCUMENTS

| | | | |
|---|---|---|---|
| JP | 410223629 | * | 2/1997 |
| JP | 10-223629 | | 8/1998 |
| JP | 11-067756 | | 3/1999 |
| JP | 2002-057154 | | 2/2002 |
| JP | 2002-064093 | | 2/2002 |

* cited by examiner

METHOD FOR FORMING SILICON DIOXIDE FILM ON SILICON SUBSTRATE, METHOD FOR FORMING OXIDE FILM ON SEMICONDUCTOR SUBSTRATE, AND METHOD FOR PRODUCING SEMICONDUCTOR DEVICE

TECHNICAL FIELD

In general, the present invention relates to a method of forming a silicon dioxide film on a surface of a silicon substrate, a method of forming an oxide film on a surface of a semiconductor substrate, and a method of manufacturing a semiconductor device by these methods. These methods can be employed to form an oxide film of an MOS (metal-oxide-semiconductor) device used for semiconductor integrated circuits, especially to form an extremely thin gate oxide film, a capacitor oxide film, and the like of an MOS transistor, an MOS capacitor, and the like. In particular, the present invention relates to a method of forming a high-quality (with little leak current), extremely thin silicon dioxide film and the like with excellent film-thickness controllability.

The present invention also relates to a method of forming, for example, a silicon dioxide film of a TFT (thin-film transistor) at a low temperature.

BACKGROUND ART

Recently, the performance of semiconductor devices, such as semiconductor integrated circuits, has been improving without showing any sign of leveling off, and the need for further integration and high-density packaging is becoming more and more compelling. For example, one problem of microfabrication for further integration and high-density packaging is a problem related to an insulating film, such as a gate insulating film and a capacitor insulating film, of an MOS transistor, an MOS capacitor, and the like.

In a device (such as a silicon device) formed by using a silicon substrate, and in an MOS transistor and an MOS capacitor in particular, a silicon dioxide film is usually used as an insulating film, such as a gate insulating film and a capacitor insulating film.

As a result of microfabrication of the device, the insulating film becomes extremely thin. For example, if the design rule is not more than 0.07 μm, the gate insulating film is required to be not thicker than 1.5 nm.

However, considering such problems as the increase of leak current, it is estimated that the limit of microfabrication of silicon dioxide film is 1.5 nm to 1.2 nm. In view of this, the use of such highly dielectric materials as $Al_2O_3$ and $Ta_2O_5$ is considered, but by they are not yet used practically. Even if these highly dielectric materials are put into practical use, the introduction of these new materials will require a great amount of initial investment.

Conventionally, the oxide film (gate oxide film) used as a gate insulating film of an MOS transistor has been formed by heating a silicon substrate at a high temperature of not lower than 800° C. in an oxidizing gas such as dry oxygen or vapor. However, if an extremely thin oxide film of not thicker than 2 nm is formed by high-temperature thermal oxidation, there is a problem that the oxide film cannot be used as a gate insulating film because of its high leak current density. In addition, it is difficult to control the thickness of the oxide film formed by high-temperature thermal oxidation, because the initial growth rate of the oxide film is high. Therefore, it is difficult to form an extremely thin oxide film by high-temperature thermal oxidation. Moreover, the high-temperature thermal oxidation also has a problem that the dopant diffuses when heated at a high temperature, resulting in the destruction of shallow junctions.

Other than high-temperature thermal oxidation, there are such methods as chemical vapor-phase growth (in which such material as monosilane is thermally decomposed and deposited on a surface of the silicon substrate), a method in which an oxide film is formed by anodic oxidation, various kinds of vapor deposition such as sputter vapor deposition, and a method of oxidizing in plasma. However, these methods also have the same problems in terms of film quality and film-thickness controllability.

In particular, the increase of the leak current density not only causes various problems such as the increase of power consumption of the device, the increase of operating temperature, the deterioration of stability, and the like, but also destabilizes the operation of the device if the amount of leak current is substantially equal to the amount of drain current.

In view of these problems, the inventors of the present invention invented a method of forming an oxide film by chemical oxidization and filed a patent application (patent publication 1: Japanese Laid-Open Patent Publication, Tokukai 2002-64093 (publication date: Feb. 28, 2002)). According to this method, a chemical oxide film is formed by soaking a silicon substrate into, for example, concentrated nitric acid. Then, the chemical oxide film is heat-processed in an inactive gas such as nitrogen. The heat processing decreases the leak current in the oxide film. This method is POA (postoxidization annealing), because the heat processing is performed after the oxide film is formed.

The inventers of the present invention invented another method of forming an oxide film by chemical oxidization and filed a patent application (patent publication 2: Japanese Laid-Open Patent Publication, Tokukaihei 9-45679 (publication date: Feb. 14, 1997)). According to this method, a chemical oxide film is formed by soaking a silicon substrate into, for example, concentrated nitric acid. Then, a metal film (e.g. platinum) having a function of oxidation catalyst is formed on the oxide film. After that, the oxide film is grown by heat processing in an oxidizing atmosphere.

The inventers of the present invention invented yet another method of forming an oxide film by chemical oxidization and filed a patent application (patent publication 3: Japanese Laid-Open Patent Publication, Tokukai 2002-57154 (publication date: Feb. 22, 2002)). According to this method, a chemical oxide film is formed by soaking a silicon substrate into, for example, concentrated nitric acid. Then, a metal film (e.g. platinum) having a function of oxidation catalyst is formed on the oxide film, followed by heat processing in an oxidizing atmosphere. Thereafter, the metal film and a part of the oxide film are removed by etching so as to reduce the thickness of the oxide film, and an electrode is formed on the oxide film.

According to the method of patent publication 1, the heat processing in the inactive gas is required to be performed at a relatively high temperature. If the heat processing in the inactive gas is performed at a high temperature, there is a problem that the thickness of the oxide film increases due to a very small amount of an oxidizing species, such as vapor and oxygen, mixed in the inactive gas.

Another problem of the method of patent publication 1 is that diffusion of the dopant is caused by the heat processing at a high temperature as in the case of high-temperature thermal oxidation, resulting in the destruction of shallow junctions. Moreover, there is also a problem that the heat processing at a high temperature cannot decrease the leak current density with sufficient reproducibility.

The method of patent publication 2 is not suitable for forming an extremely thin oxide film, because the method has a step of growing the oxide film. The method of patent publication 2 cannot effectively decrease the leak current density of the oxide film, either.

According to the method of patent publication 3, it is difficult to control the thickness of the oxide film, because it is necessary to reduce the thickness by etching. Moreover, if some parts of the oxide film are extremely thin as a result of etching, the leak current density increases. Therefore, it is difficult to decrease the leak current density with sufficient reproducibility.

Incidentally, the gate oxide film of a TFT has been conventionally formed by CVD (chemical vapor deposition) in which deposition is caused at a substrate temperature of about 600° C.

In order to manufacture a flexible liquid crystal display, the TFT is required to be formed on a substrate of organic material such as PET (polyethylene terephthalate). For this purpose, the TFT must be formed at a low temperature of not higher than 200° C. However, in order to deposit the silicon dioxide film by CVD, it is necessary to heat the substrate to a high temperature of 400° C. to 500° C. Thus, the deposition of silicon dioxide film by CVD is not suitable for the formation of TFT in manufacturing a flexible liquid crystal display.

In the above-described TFT, in general, a relatively high voltage is applied to the gate electrode. Therefore, in order to prevent dielectric breakdown, the silicon dioxide film used as the gate oxide film needs to have a sufficient thickness.

The present invention was made in view of the foregoing problems. An object of the present invention is therefore to provide (i) a method of forming an oxide film on a surface of a semiconductor substrate, by which a high-quality (with low leak current density), extremely thin oxide film can be formed on a surface of a silicon substrate with excellent film-thickness controllability and at a low temperature, (ii) in particular, a method of forming a silicon dioxide film on a surface of a silicon substrate, by which a high-quality (with low leak current density), extremely thin silicon dioxide film can be formed on a surface of a silicon substrate with excellent film-thickness controllability and at a low temperature, and (iii) a method of manufacturing a semiconductor device by these methods. Another object of the present invention is to provide a method of forming a silicon dioxide film at a low temperature, so that the silicon dioxide film can be formed on a substrate of organic material such as PET.

DISCLOSURE OF INVENTION

A method of forming a silicon dioxide film on a surface of a silicon substrate in accordance with the present invention includes the steps of: forming a silicon dioxide film on a surface of a silicon substrate by supplying a drug solution to the surface of the silicon substrate; depositing a film containing metal atoms on the silicon dioxide film; and heat-processing the silicon substrate, on which the film containing metal atoms is deposited, in a hydrogen-containing gas.

A method of forming a silicon dioxide film on a surface of a silicon substrate in accordance with the present invention includes the steps of: forming a silicon dioxide film on a surface of a silicon substrate by supplying vapor of a drug solution to the surface of the silicon substrate; depositing a film containing metal atoms on the silicon dioxide film; and heat-processing the silicon substrate, on which the film containing metal atoms is deposited, in a hydrogen-containing gas.

According to these methods, through the heat processing in the hydrogen-containing gas, hydrogen reacts with the silicon dioxide film, resulting in disappearance of the interface states and defect states in the silicon dioxide film. It can be assumed that, at this time, the presence of the film containing metal atoms facilitates decomposition of hydrogen and thereby facilitates the disappearance of the interface states and defect states in the silicon dioxide film. As a result, it is possible to improve quality of the silicon dioxide film, and to form a high-quality (with low leak current density), extremely thin oxide film.

The thickness of the silicon dioxide film can be controlled easily by adjusting the kind, concentration, and temperature of the drug solution.

According to the foregoing methods, the silicon dioxide film can be modified through heat processing in the hydrogen-containing gas. Therefore, it is not necessary to perform heat processing in an oxidizing atmosphere. As a result, the thickness of the silicon oxide film does not increase easily, that is, the silicon oxide film possesses excellent film-thickness controllability.

Furthermore, the heat processing can be performed at a relatively low temperature. Therefore, the thickness of the silicon dioxide film does not increase easily even if oxygen or the like is mixed in, that is, the silicon dioxide film possesses excellent film-thickness controllability.

Thus, it is possible to form a high-quality (with low leak current density), extremely thin (0.3 nm to 5 nm in thickness) silicon dioxide film on the surface of the silicon substrate.

It is preferable that a method of forming a silicon dioxide film on a surface of a silicon substrate in accordance with the present invention is the foregoing method, wherein: the drug solution is selected from the group consisting of nitric acid, sulfuric acid, ozonic water, hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitrohydrochloric acid, perchloric acid, and boiling water.

It is preferable that a method of forming a silicon dioxide film on a surface of a silicon substrate in accordance with the present invention is the foregoing method, wherein: the vapor of a drug solution is vapor of a drug solution selected from the group consisting of nitric acid, sulfuric acid, ozonic water, hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitrohydrochloric acid, perchloric acid, and water.

By using the foregoing drug solution or the vapor of the foregoing drug solution, it is possible to form an extremely thin (0.3 nm to 5 nm in thickness) silicon dioxide film at a low temperature of not higher than 500° C. with excellent film-thickness controllability.

It is preferable that a method of forming a silicon dioxide film on a surface of a silicon substrate in accordance with the present invention is the foregoing method, wherein: the drug solution is selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water.

It is preferable that a method of forming a silicon dioxide film on a surface of a silicon substrate in accordance with the present invention is the foregoing method, wherein: the vapor of a drug solution is vapor of a drug solution selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water.

In an azeotropic state, the concentration of the drug solution or of the vapor of the drug solution does not easily change with time. Therefore, the thickness of the silicon dioxide film to be formed can be controlled with excellent reproducibility by using the drug solution or of the vapor of the drug solution in an azeotropic state.

It is preferable that a method of forming a silicon dioxide film on a surface of a silicon substrate in accordance with the present invention is any one of the foregoing methods, wherein: the film containing metal atoms is a film containing metal atoms selected from the group consisting of aluminum, magnesium, nickel, chrome, platinum, palladium, tungsten, titanium, and tantalum.

If the film containing metal atoms is deposited on the silicon dioxide film, the heat processing in the hydrogen-containing gas can easily cause reaction of hydrogen with the interface states and defect states. As a result, the interface states and defect states of the silicon dioxide film disappear effectively, thereby improving the quality of the silicon dioxide film.

It is preferable that a method of forming a silicon dioxide film on a surface of a silicon substrate in accordance with the present invention is any one of the foregoing methods, wherein: the hydrogen-containing gas is hydrogen or a mixed gas of hydrogen and a gas selected from the group consisting of nitrogen, argon, neon, water vapor, and oxygen.

If the foregoing gas is used, hydrogen reacts with the interface states and defect states of the silicon dioxide film. As a result, the interface states and defect states of the silicon dioxide film disappear, thereby improving the quality of the silicon dioxide film.

It is preferable that a method of forming a silicon dioxide film on a surface of a silicon substrate in accordance with the present invention is any one of the foregoing methods, wherein: a temperature of the silicon substrate during the heat processing in the hydrogen-containing gas is within a range of 50° C. to 350° C.

Within the foregoing temperature range, the interface states and defect states in the silicon dioxide film disappear effectively, and reaction between (i) the film containing metal atoms and (ii) the silicon dioxide film can be prevented.

It is preferable that a method of forming a silicon dioxide film on a surface of a silicon substrate in accordance with the present invention is the foregoing method, wherein: the heat processing in the hydrogen-containing gas is conducted for a period within a range of 1 minute to 120 minutes.

If the period of the heat processing in the hydrogen-containing gas is not shorter than 1 minute, the hydrogen diffuses (i) the film containing metal atoms and (ii) the silicon dioxide film, thereby modifying the silicon dioxide film effectively. In addition, if the time of the heat processing in the hydrogen-containing gas is not longer than 120 minutes, the increase of device preparation time is unlikely to be a problem. Moreover, even if the temperature of the heat processing in the hydrogen-containing gas is close to 350° C., reaction between (i) the film containing metal atoms and (ii) the silicon dioxide film can be prevented as long as the period of heat processing is not longer than 120 minutes.

It is preferable that a method of forming a silicon dioxide film on a surface of a silicon substrate in accordance with the foregoing method is any one of the foregoing methods, wherein: a natural oxide film or impurities existing on the surface of the silicon substrate are removed before forming the silicon dioxide film on the surface of the silicon substrate.

If, as described above, the natural oxide film or impurities existing on the surface of the silicon substrate are removed and the clean silicon surface is exposed, it is possible to form a high-quality silicon dioxide film.

It is preferable that a method of forming a silicon dioxide film on a surface of a silicon substrate in accordance with the foregoing method is the foregoing method, wherein: the silicon substrate is heated in supplying the vapor of a drug solution to the surface of the silicon substrate. By doing so, it is possible to increase the rate of oxidization.

It is preferable that a method of forming a silicon dioxide film on a surface of a silicon substrate in accordance with the present invention is the foregoing method, wherein: a temperature of the silicon substrate heated in supplying the vapor of a drug solution to the surface of the silicon substrate is within a range of 50° C. to 500° C.

By setting the temperature of the silicon substrate to not lower than 50° C. in heating the silicon substrate in supplying the vapor of a drug solution, it is possible to increase the rate of oxidization effectively. In this way, a silicon dioxide film having a thickness of not less than 1 nm can be formed easily (if the temperature is lower than 50° C., it is difficult to form a silicon dioxide film having a thickness of not less than 1 nm). Moreover, by setting the temperature to not higher than 500° C., it is possible to avoid excessively accelerating oxidization, and thereby control the film thickness easily.

A method of forming a silicon dioxide film on a surface of a silicon substrate in accordance with the present invention includes the steps of: forming a silicon dioxide film on a surface of a silicon substrate by supplying a drug solution to the surface of the silicon substrate; and heat-processing the silicon substrate, on which the silicon dioxide film is formed, in a hydrogen-containing gas.

A method of forming a silicon dioxide film on a surface of a silicon substrate in accordance with the present invention includes the steps of: forming a silicon dioxide film on a surface of a silicon substrate by supplying vapor of a drug solution to the surface of the silicon substrate; and heat-processing the silicon substrate, on which the silicon dioxide film is formed, in a hydrogen-containing gas.

According to the foregoing method, through the heat processing in he hydrogen-containing gas, the hydrogen reacts with the interface states and defect states in the silicon dioxide film, thereby forming Si—H bonds. As a result, the interface states and defect states disappear. In this case, unlike the foregoing method, the effect of decomposing hydrogen due to the presence of the film containing metal atoms cannot be attained. However, by increasing the temperature of the heat processing, it is possible to accelerate reaction of the hydrogen with the interface states and defect states. As a result, quality of the silicon dioxide film is improved, and it is possible to form a high-quality (with low leak current density), extremely thin oxide film.

In the foregoing method, it is preferable that a temperature of the silicon substrate during the heat processing in the hydrogen-containing gas is within a range of 350° C. to 500° C.

If the temperature of the silicon substrate during the heat processing in the hydrogen-containing gas is lower than 350° C., it is difficult to form the Si—H bonds by reacting the hydrogen with the interface states and defect states. If, on the other hand, the temperature is higher than 500° C., the Si—H bonds split up even if they are successfully formed, and the interface states and defect states are generated again. Therefore, in order to cause disappearance of the interface states and defect states effectively, it is preferable to set the temperature to 350° C. to 500° C.

A method of forming a silicon dioxide film on a surface of a silicon substrate in accordance with the present invention includes the steps of: forming a silicon dioxide film on a surface of a silicon substrate by supplying vapor of a drug solution to the surface of the silicon substrate; and heat-processing the silicon substrate, on which the silicon dioxide film is formed, in a hydrogen-containing gas.

In order to form the silicon dioxide film through deposition by CVD, the substrate must be heated to a high temperature of about 400° C. to 500° C. Therefore, forming the silicon dioxide film by CVD is not suitable, for example, for forming TFTs in manufacturing a flexible liquid crystal display.

In contrast, according to the foregoing method, the silicon dioxide film can be formed easily even if the silicon substrate is at a low temperature of not higher than 200° C. Therefore, this method is suitable for forming TFTs in manufacturing a flexible liquid crystal display.

It is preferable that a method of forming a silicon dioxide film on a surface of a silicon substrate in accordance with the present invention is the foregoing method, wherein: the vapor of a drug solution is vapor of a drug solution selected from the group consisting of nitric acid, sulfuric acid, and perchloric acid.

According to the foregoing method, even if the silicon substrate is at a low temperature of not higher than 200° C., it is easy to form a chemical oxide film having a thickness of not less than 2 nm, and it is even possible to form a chemical oxide film having a thickness of not less than 10 nm.

It is preferable that a method of forming a silicon dioxide film on a surface of a silicon substrate in accordance with the present invention is the foregoing method, wherein: the vapor of a drug solution is vapor of a drag solution selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water.

In an azeotropic state, the concentration of the drug solution or of the vapor of the drug solution does not easily change with time. Therefore, by using the drug solution or the vapor of the drug solution in the azeotropic state, the thickness of the silicon dioxide film to be formed can be controlled with excellent reproducibility.

A method of manufacturing a semiconductor device in accordance with the present invention includes the step of: forming a silicon dioxide film on a surface of a silicon substrate by any one of the foregoing methods. According to this method, it is possible to manufacture a semiconductor device that includes the high-quality, extremely thin oxide film.

The present invention is also applicable in the case of forming an oxide film on a surface of a semiconductor substrate other than the silicon substrate. Specifically, a method of forming an oxide film on a surface of a semiconductor substrate in accordance with the present invention includes the steps of: forming an oxide film on a surface of a semiconductor substrate by supplying a drug solution to the surface of the semiconductor substrate; depositing a film containing metal atoms on the oxide film; and heat-processing the semiconductor substrate, on which the film containing metal atoms is deposited, in a hydrogen-containing gas.

A method of forming an oxide film on a surface of a semiconductor substrate in accordance with the present invention includes the steps of: forming an oxide film on a surface of a semiconductor substrate by supplying vapor of a drug solution to the surface of the semiconductor substrate; depositing a film containing metal atoms on the oxide film; and heat-processing the semiconductor substrate, on which the film containing metal atoms is deposited, in a hydrogen-containing gas.

Like the foregoing methods, these methods make it possible to form a high-quality (with low leak current density), extremely thin oxide film on the surface of the semiconductor substrate.

A method of manufacturing a semiconductor device in accordance with the present invention includes the step of: forming an oxide film on a surface of a semiconductor substrate by the foregoing method. According to this method, it is possible to manufacture a semiconductor device that includes the high-quality, extremely thin oxide film.

For a fuller understanding of the nature and advantages of the invention, reference should be made to the ensuing detailed description taken in conjunction with the accompanying drawings.

BEST MODE FOR CARRYING OUT THE INVENTION

[First Embodiment]

Figure 1:
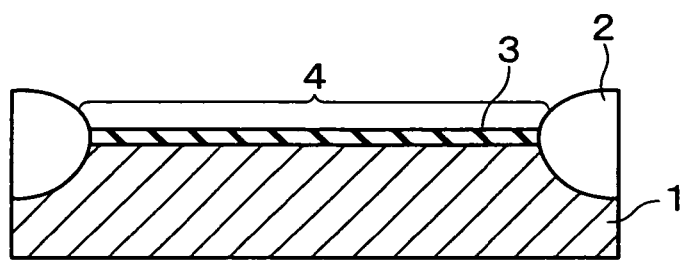
FIGS. 1(a) to 1(f) are cross-sectional views respectively illustrating steps in a method of forming a silicon dioxide film on a surface of a silicon substrate in accordance with a first embodiment of the present invention.
Figure 1:
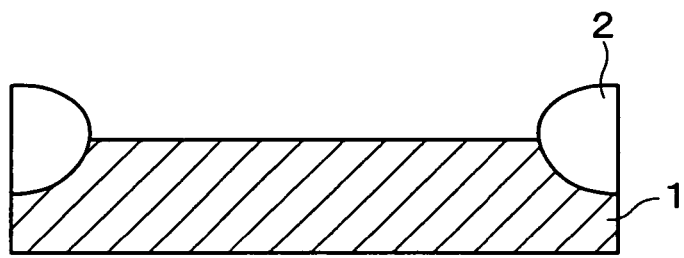
Figure 1:
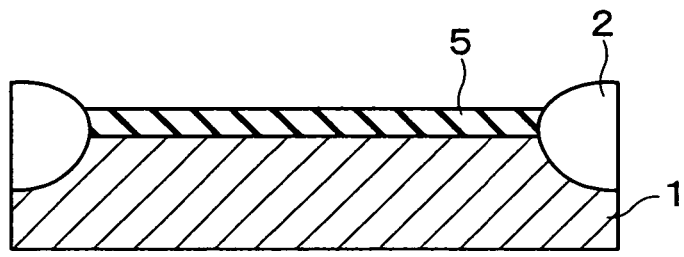
Figure 1:
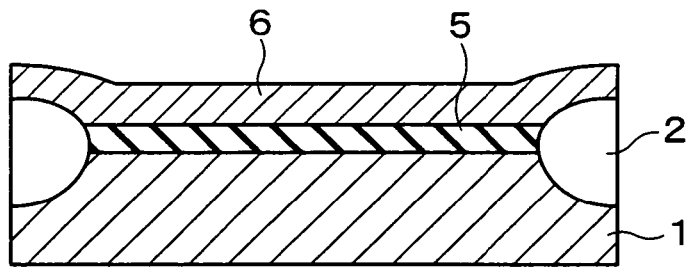
Figure 1:
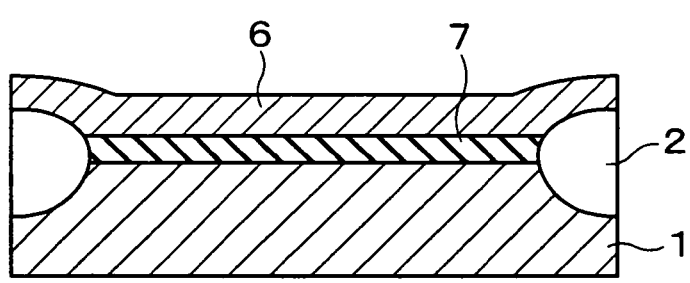
Figure 1:
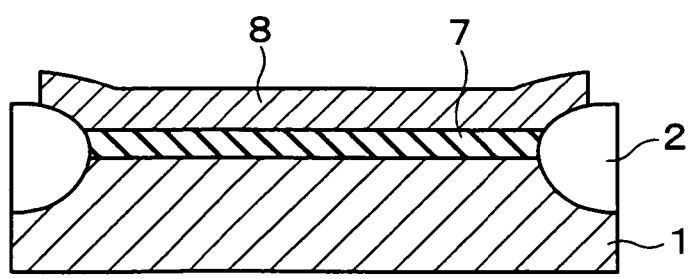

The following describes a first embodiment of the present invention, with reference to FIG. 1(a) to FIG. 7.

Described first with reference to FIGS. 1(a) to 1(f) is a method of forming a silicon dioxide film on a silicon substrate in accordance with the present embodiment. In the present embodiment, a step of forming an MOS capacitor by using a silicon substrate is described. Although the present embodiment assumes a case where the silicon dioxide film is formed on a silicon substrate 1, the present invention is also applicable, for example, to a case where the silicon dioxide film is formed on a ball-shaped silicon bulk or on a silicon film formed by epitaxial growth. In this specification, the member (e.g. silicon substrate 1) used as a base of the, silicon dioxide film to be formed is referred to as "silicon substrate".

First, an isolation region 2 and an active region 4 were formed on the silicon substrate 1. On a surface of the active region 4, there was a natural oxide film 3 (FIG. 1(a)). In the present embodiment, the silicon substrate 1 was a p-type (100) substrate whose specific resistance was 10 Ωcm to 15 Ωcm. After boron was injected as a channel stopper into the substrate 1, a LOCOS (local oxidation of silicon) oxide film having a thickness of 500 nm was formed as the isolation region 2.

Next, in order to clean the surface of the active region 4, the wafer (the term "wafer" is used when reference is made to the entire body including the silicon substrate 1 and the oxide film and the like formed on the silicon substrate 1) was cleaned by known RCA cleaning method (W. Kern and D. A. Poutinen, RCA Review 31, p. 187, 1970). After that, the cleaned wafer was soaked in a 0.5%-by-volume dilute hydrofluoric acid solution for five minutes, so as to remove the natural oxide film 3 from the surface of the active region 4 (FIG. 1(b)). In order to form a high-quality, extremely thin silicon dioxide film on the surface of the silicon substrate 1, it is preferable that a clean silicon surface is exposed. It is therefore important to completely remove the natural oxide film 3 from the surface of the silicon substrate 1 and to remove impurities from the surface of the silicon substrate 1.

Next, the wafer was rinsed (cleaned) with ultrapure water for five minutes, and then soaked in a highly oxidative drug solution (oxidizing drug solution). In the present embodiment, the wafer was soaked for 30 minutes in azeotropic nitric acid (68% by weight) whose boiling temperature is 120.7° C. In this way, a chemical oxide film (silicon dioxide film) 5 having a thickness of 1.4 nm was formed on the surface of the silicon substrate 1 in the active region 4 (FIG. 1(c)).

The drug solution in which the wafer is soaked in forming the chemical oxide film 5 can be a drug solution selected from the group consisting of nitric acid, sulfuric acid, ozonic water (water in which several dozen ppm of ozone is dissolved), hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitrohydrochloric acid, perchloric acid, and boiling water. The terms "nitric acid" and "sulfuric acid" used here includes solutions of these substances.

By using these drug solutions, an extremely thin chemical oxide film 5 having a thickness of, for example, 0.3 nm to 5 nm can be formed at a low temperature of not higher than 500° C. with excellent film-thickness controllability.

Therefore, as a method of forming the chemical oxide film 5 on the surface of the silicon substrate 1, the following methods can be employed: a method of soaking the wafer in nitric acid, a method of soaking the wafer in sulfuric acid, a method of soaking the wafer in ozonic water, a method of soaking the wafer in hydrogen peroxide solution, a method of soaking the wafer in mixed solution of hydrochloric acid and hydrogen peroxide solution, a method of soaking the wafer in sulfuric acid and hydrogen peroxide solution, a method of soaking the wafer in aqueous ammonia and hydrogen peroxide solution, a method of soaking the wafer in mixed solution of sulfuric acid and nitric acid, a method of soaking the wafer in nitrohydrochloric acid, a method of soaking the wafer in perchloric acid, and a method of soaking the wafer in boiling water.

At this time, the thickness of the chemical oxide film 5 can be controlled easily by adjusting the kind, concentration, and temperature of the drug solution.

It is not always necessary to soak the wafer into the drug solution, as long as the drug solution can be supplied to the surface of the wafer.

The chemical oxide film 5 can also be formed by a method of exposing the wafer to vapor of drug solution, instead of the method of soaking the wafer in the drug solution. The vapor of drug solution to which the wafer is exposed in forming the chemical oxide film 5 can be the vapor of the drug solution described above as a drug solution into which the wafer is soaked in forming the chemical oxide film 5, that is, vapor of a drug solution selected from the group consisting of nitric acid, sulfuric acid, ozonic water (water in which several dozen ppm of ozone is dissolved), hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitrohydrochloric acid, perchloric acid, and water.

In exposing the wafer to the vapor of the drug solution, it is preferable to heat the wafer. By heating the wafer, it is possible to increase the rate of oxidization.

It is preferable that the temperature of the wafer at this time is within the range of 50° C. to 500° C. By setting the temperature of the wafer not lower than 50° C., it is possible to increase the rate of oxidization effectively. In this way, a chemical oxide film 5 having a thickness of not less than 1 nm can be formed easily (if the temperature of the wafer is lower than 50° C., it is difficult to form a chemical oxide film 5 having a thickness of not less than 1 nm). Moreover, by setting the temperature of the wafer not higher than 500° C., it is possible to avoid excessively accelerating oxidization, and thereby control the thickness of the chemical oxide film 5 easily.

It is preferable that the drug solution into which the wafer is soaked or the vapor of drug solution to which the wafer is exposed in forming the chemical oxide film 5 is a drug solution or vapor of a drug solution selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water. In an azeotropic state, the concentration of the drug solution or vapor does not easily change with time. Therefore, the thickness of the chemical oxide film 5 to be formed can be controlled with excellent reproducibility. This is why the foregoing drug solutions and vapor are preferable.

In the present embodiment, azeotropic nitric acid is used in order to form a clean and high-quality chemical oxide film 5 including no such substance as heavy metal. Although the thickness of the chemical oxide film 5 is 1.4 nm in the present embodiment, an extremely thin chemical oxide film 5 having a thickness of, for example, 0.3 nm to 5 nm (preferably 0.5 nm to 2.0 nm) may be formed.

Next, a metal film 6 (film containing metal atoms) was deposited on the chemical oxide film 5 and the isolation region 2 (FIG. 1(d)). The metal film 6 was an aluminum (aluminum-silicon alloy) film having a thickness of 200 nm and including 1% by weight of silicon. The metal film 6 was deposited by resistive heating vapor deposition. Examples of the film containing metal atoms are a film containing metal atoms selected from the group consisting of aluminum, magnesium, nickel, chrome, platinum, palladium, tungsten, titanium, and tantalum. It is preferable that the film containing metal atoms is a film containing active metal atoms. For example, it is preferable that the film containing metal atoms is a metal film of aluminum, magnesium, nickel, or the like, or an alloy film such as silicon-containing aluminum. Alternatively, the film containing metal atoms may be a compound such as titanium nitride and tantalum pentoxide.

Next, the wafer is heated in a hydrogen-containing gas in an electric furnace. In the present embodiment, the wafer was heated in a mixed gas of hydrogen and nitrogen (nitrogen containing 5% of hydrogen) at 200° C. for 20 minutes. This heat processing, being performed after the formation of the metal film 6, is PMA (post metallization annealing). This heat processing is performed to react hydrogen with interface states and defect states and thereby cause them to disappear. In this way, the electric property of the chemical oxide film 5 is improved. It can be assumed that the presence of the metal film 6 makes it easier to decompose the hydrogen, and thereby makes it easy to cause disappearance of the interface states and defect states in the chemical oxide film 5. The heat processing did not change the thickness of the chemical oxide film 5. As a result of the heat processing, a modified chemical oxide film 7 (hereinafter referred to as "modified oxide film" or "modified silicon dioxide film") was formed (FIG. 1(e)).

Examples of the hydrogen-containing gas used in the heat processing are hydrogen or a mixed gas of hydrogen and a gas selected from the group consisting of nitrogen, argon, neon, water vapor, and oxygen.

Therefore, other than in the mixed gas of hydrogen and nitrogen, the heat processing can also be performed, for example, in hydrogen, in a mixed gas of hydrogen and nitrogen, in a mixed gas of hydrogen and argon, in a mixed gas of hydrogen and neon, in a mixed gas of hydrogen and water vapor, and in a mixed gas of hydrogen and oxygen.

The temperature of the wafer in the heat processing is not limited to 200° C. Substantially the same effect of improving the electric property of the chemical oxide film 5 is attained as long as the temperature of the wafer is within the range of 50° C. to 350° C. The period of heat processing is not limited to 20 minutes. Substantially the same effect of improving the electric property of the chemical oxide film 5 is attained as long as the period of heat processing is 1 minute to 120 minutes. If the period of heat processing is not shorter than 1 minute, the hydrogen diffuses the metal film 6 and the chemical oxide film 5, thereby modifying the chemical oxide film 5 effectively. In addition, if the period of heat processing is not longer than 120 minutes, the increase of device preparation time is unlikely to be a problem. Moreover, even if the temperature of the wafer in the heat processing is close to 350° C., reaction between the metal film 6 and the chemical oxide film 5 can be prevented as long as the period of heat processing is not longer than 120 minutes.

Thus, according to the present method, the chemical oxide film 5 can be modified through the heat processing in the hydrogen-containing gas. Therefore, it is not necessary to perform heat processing in an oxidizing atmosphere. As a result, the thickness of the chemical oxide film does not increase easily, that is, excellent film-thickness controllability is attained.

Furthermore, the heat processing in the hydrogen-containing gas is effective even at a relatively low temperature. Therefore, the thickness of the chemical oxide film does not increase easily even if oxygen or the like is mixed in, that is, excellent film-thickness controllability is attained.

In order to increase the film thickness intentionally, the hydrogen-containing gas may be a mixed gas of hydrogen and water vapor, a mixed solution of hydrogen and oxygen, or the like.

Then, by a known photography technology, a patterned resist film (not shown) was formed on the metal film 6. Subsequently, by a known dry etching technology, the metal film 6 was etched and patterned. In this way, an electrode 8 was formed (FIG. 1(f)).

Described next are properties of the chemical oxide film 5 and the modified chemical oxide film 7 formed by the foregoing method. Unless otherwise noted, in the present embodiment, the term "chemical oxide film formation processing" refers to the processing for forming the chemical oxide film 5 by soaking the wafer (finished with such processing as removal of natural oxide film and cleaning) for 30 minutes in 68%-by-weight azeotropic nitric acid heated to the azeotropic temperature of 120.7° C. (processing of FIGS. 1(*a*) to 1(*c*)); the term "metal film formation processing" refers to the processing for forming the metal film 6 (which is made of aluminum-silicon alloy) having a thickness of 200 nm on the chemical oxide film 5 formed by the chemical oxide film formation processing (processing of FIG. 1(*d*)); and the term "oxide film modifying heat processing" refers to the processing of introducing the wafer after the metal film formation processing into an electric furnace and heating the wafer in nitrogen (which contains 5% of hydrogen) at 200° C. for 20 minutes (processing of FIG. 1(*e*)).

Figure 2:
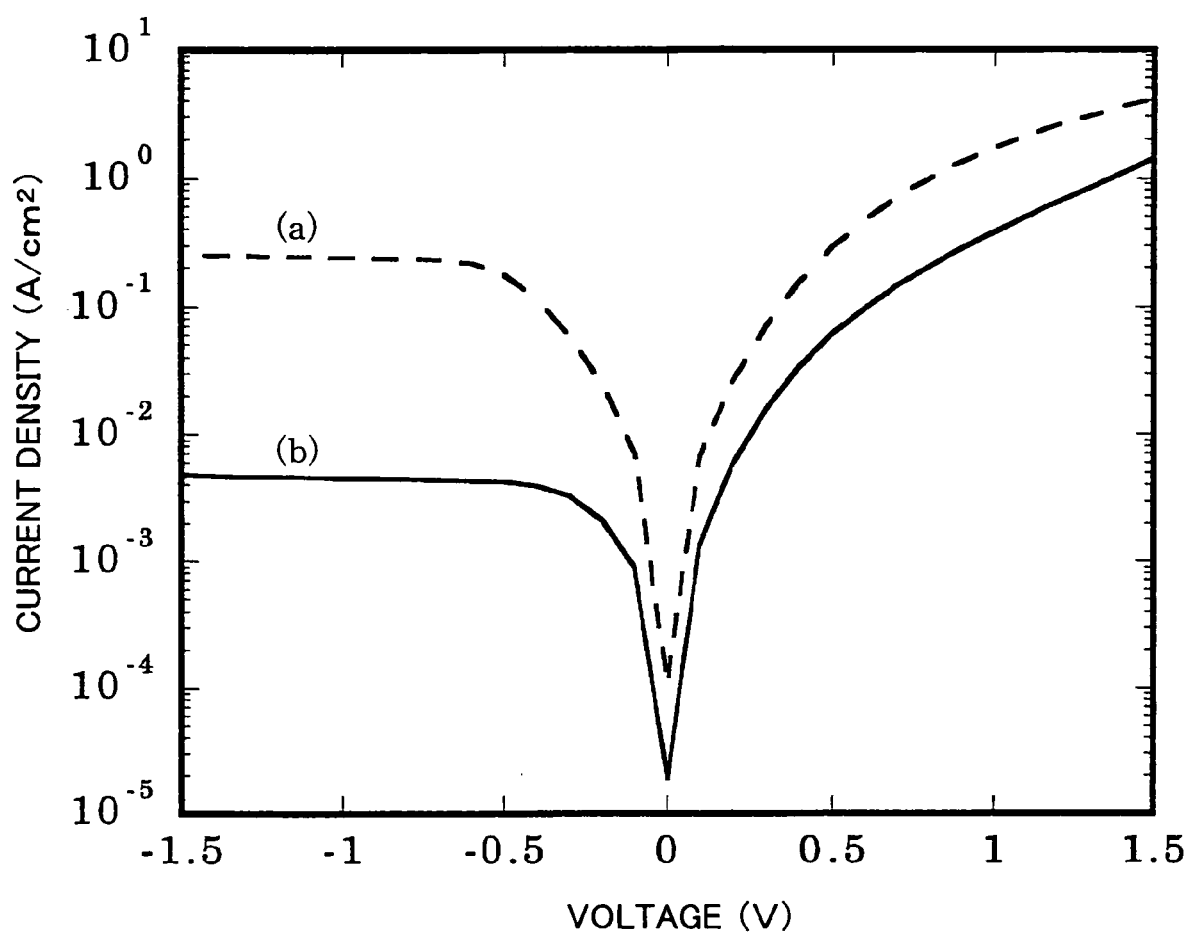
FIG. 2 is a graph illustrating the relationship between applied voltage and leak current density, with respect to a silicon dioxide film (a) (formed for the purpose of comparison) and a silicon dioxide film (b) (formed by the method of FIGS. 1(a) to 1(f)).

FIG. 2 is a graph showing the relationship between the voltage applied to the electrode (silicon substrate reverse side electrode) 8, which is provided on the reverse side of the silicon substrate 1, and the leak current density (measurement result) of the leak current flowing in the chemical oxide film 5 or the modified chemical oxide film 7. In FIG. 2, plot (a) indicates the leak current density of the chemical oxide film 5 formed by the chemical oxide film formation processing and metal film formation processing, and plot (b) indicates the leak current density of the modified chemical oxide film 7 formed by the chemical oxide film formation processing, metal film formation processing, and oxide film modifying heat processing.

From plot (a), it was found that the leak current density was relatively high if the chemical oxide film 5 was not subjected to the oxide film modifying heat processing. If the applied voltage was 1V, the leak current density was about 2 A/cm$^2$, which was nearly equal to that of the oxide film having a thickness of 1.4 nm formed by ordinary high-temperature thermal oxidization. On the other hand, from plot (b), it was found that the leak current density was decreased to about one-fifth of the leak current density of plot (a) if the chemical oxide film 5 was subjected to the oxide film modifying heat processing. If the applied voltage was 1V, the leak current density was about 0.4 A/cm$^2$, which was lower than that of the oxide film formed by high-temperature thermal oxidization.

Figure 3:
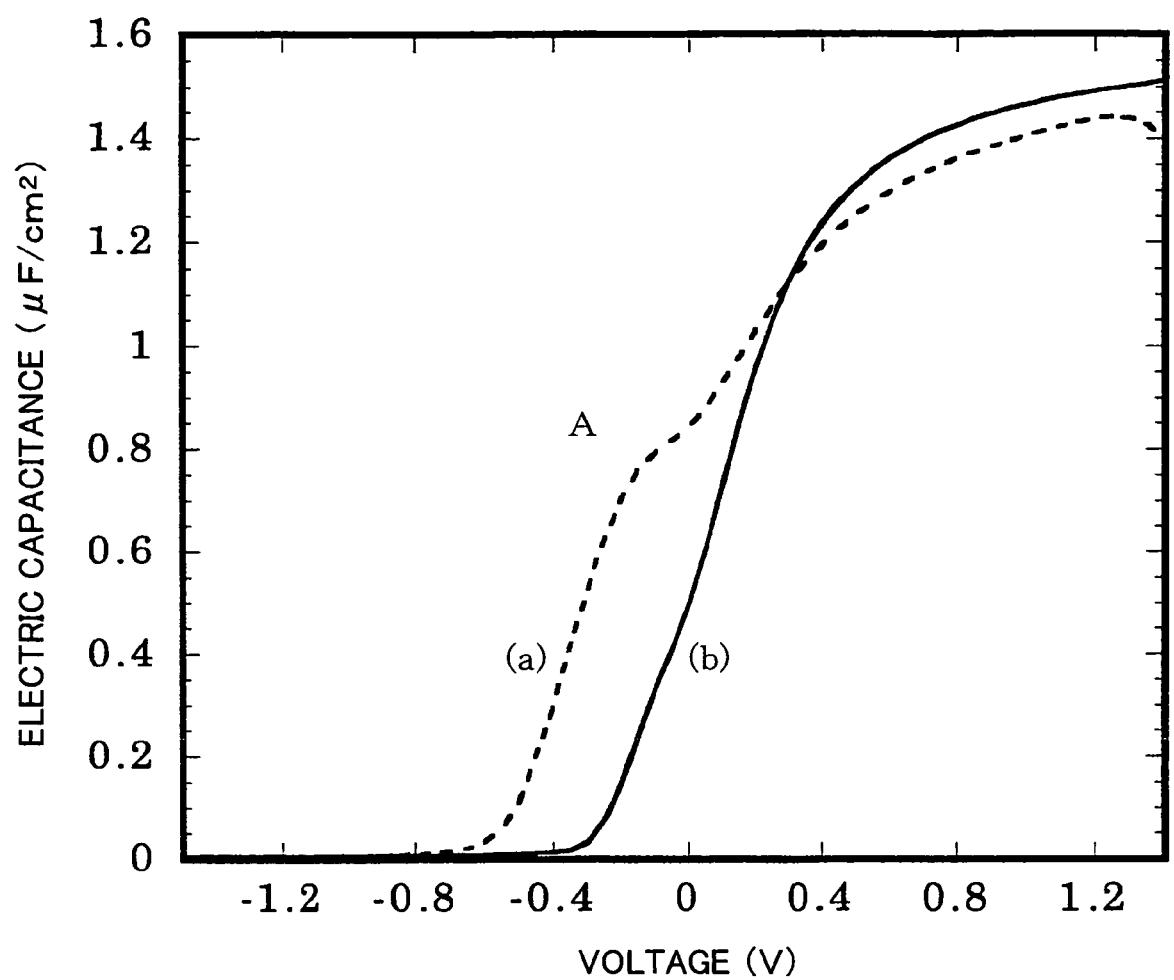
FIG. 3 is a graph illustrating the relationship between applied voltage and electric capacitance, with respect to a silicon dioxide film (a) (formed for the purpose of comparison) and a silicon dioxide film (b) (formed by the method of FIGS. 1(a) to 1(f)).

FIG. 3 is a graph (C-V curve) illustrating the relationship between the applied voltage and the electric capacitance that depends upon the chemical oxide film 5 or the modified chemical oxide film 7. In FIG. 3, curve (a) is a C-V curve on the chemical oxide film 5 formed by the chemical oxide film formation processing and metal film formation processing, and curve (b) is a C-V curve on the modified chemical oxide film 7 formed by the chemical oxide film formation processing, metal film formation processing, and oxide film modifying heat processing.

The curve (a) had a shoulder A. This indicates the existence of defect states in the chemical oxide film 5 and the existence of interface states at an interface of oxide film/silicon. On the other hand, the curve (b) had no shoulder. This indicates that the defect states and interface states disappeared as a result of the oxide film modifying heat processing.

Figure 4:
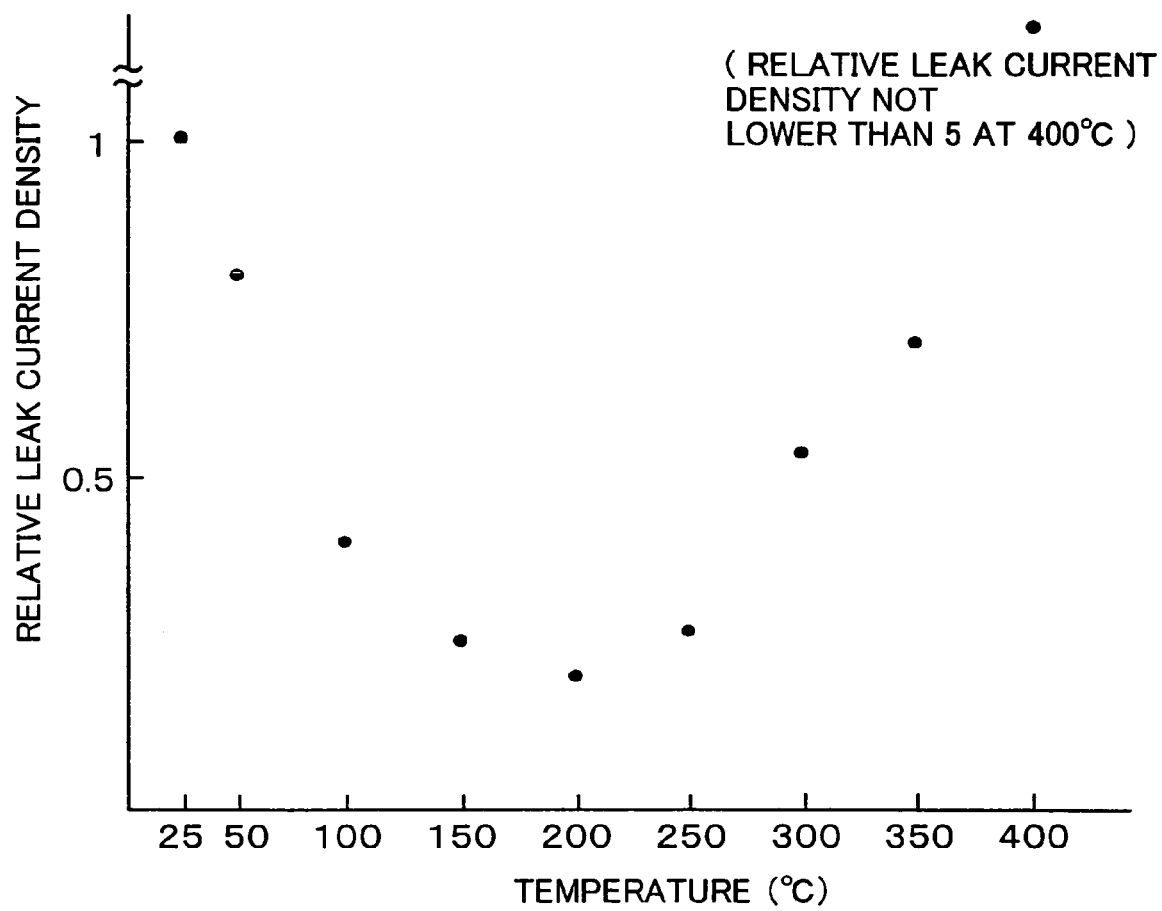
FIG. 4 is a graph illustrating changes of the leak current density of the silicon dioxide film formed at different temperatures of heat processing in a hydrogen-containing gas by the method of FIGS. 1(a) to 1(f).

FIG. 4 is a graph illustrating changes of the leak current density of the modified chemical oxide film 7 formed by the chemical oxide film formation processing, metal film formation processing, and oxide film modifying heat processing, the changes being caused by changing the temperature of the wafer in the oxide film modifying heat processing.

The result of FIG. 4 is about the leak current density of the case where the applied voltage is 1V, and indicates relative values of the leak current density (relative leak current density) on the assumption that the leak current density is 1 if the oxide film modifying heat processing is not performed.

From FIG. 4, it was found that the leak current density decreased not only when the temperature of the wafer in the oxide film modifying heat processing was 200° C., but also when the temperature of the wafer was within the range of 50° C. to 350° C. It was also found that, if the temperature of the wafer was within the range of 100° C. to 250° C., the electric property of the modified chemical oxide film 7 improved drastically, because the leak current density decreased to not higher than 50% of the case where the oxide film modifying heat processing was not performed.

Figure 5:
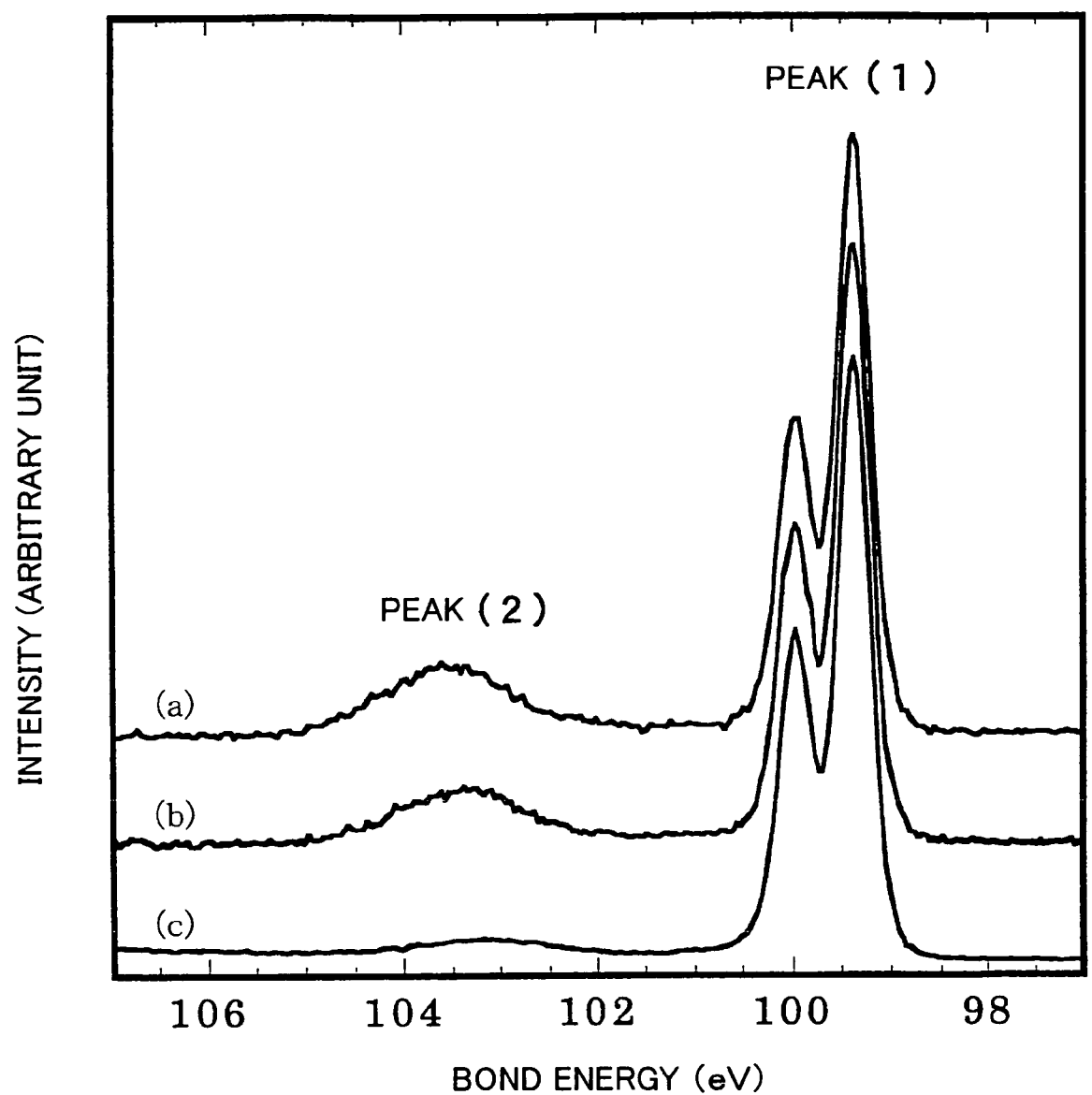
FIG. 5 is a graph illustrating X-ray photoelectron spectrums from the 2p orbit of silicon atoms in a silicon dioxide film (a) (formed for the purpose of comparison), a silicon dioxide film (b) (formed by the method of FIGS. 1(a) to 1(f)), and a silicon dioxide film (c) (formed by the method of FIGS. 1(a) to 1(f) at a different temperature of the heat processing in the hydrogen-containing gas).

FIG. 5 is a graph illustrating X-ray photoelectron spectrums from the 2p orbit of silicon atoms of the chemical oxide film formed on the silicon substrate 1. In FIG. 5, spectrum (a) is an X-ray photoelectron spectrum observed after the chemical oxide film 5 was formed by the chemical oxide film formation processing; spectrum (b) is an X-ray photoelectron spectrum observed after (i) the modified chemical oxide film 7 was formed by the chemical oxide film formation processing, metal film formation processing, and oxide film modifying heat processing, and (ii) the aluminum-silicon alloy film was removed by etching with hydrochloric acid; and spectrum (c) is an X-ray photoelectron spectrum observed after (i) the modified chemical oxide film 7 was formed by the chemical oxide film formation processing, metal film formation processing, and oxide film modifying heat processing in which the wafer was heated to a newly set temperature of 400° C., and (ii) the aluminum-silicon alloy film was removed by etching with hydrochloric acid.

The X-ray photoelectron spectrums were measured by using ESCALAB220i-XL (product of VG). The X-ray source was Al Ka radiation, which has energy of 1487 eV. The photoelectrons were observed in a direction perpendicular to the surface.

The peak (1) in FIG. 5 is caused by the photoelectrons from the 2p orbit of silicon atoms of the silicon substrate 1. The peak (2) in FIG. 5 is caused by photoelectrons from the 2p orbit of the silicon atoms of the chemical oxide film 5 or the modified chemical oxide film 7. Based on the ratio of the area intensity at peak (2) with respect to the area intensity at peak (1), the thickness of the chemical oxide film 5 and the modified chemical oxide film 7 was calculated. Here, an average free path of the photoelectrons from the 2p orbit of silicon atoms was 3.3 nm in the chemical oxide film 5 and in the modified chemical oxide film 7, and 2.7 nm in the silicon substrate 1. The average free path was determined so that the thickness (not less than 3 nm) of the oxide film recorded the same value when measured by ellipsometry and when calculated based on the X-ray photoelectron spectrum.

Based on the ratio of the area intensity at peak (2) of spectrum (a) with respect to the area intensity at peak (1) of spectrum (a), the thickness of the chemical oxide film 5 was calculated as 1.4 nm.

In spectrum (b), the ratio of the area intensity at peak (2) with respect to the area intensity at peak (1) was almost identical to that of the spectrum (a). This means that the thickness of the modified chemical oxide film 7 hardly changes through the oxide film modifying heat processing in which the temperature of the wafer is 200° C.

In spectrum (c), the ratio of the area intensity at peak (2) with respect to the area intensity at peak (1) decreases drastically. Based on the ratio of the area intensity, the thickness of the chemical oxide film 7 in this case was calculated as 0.2 nm, which indicates a decrease of the film thickness.

This experimental result shows that, if the wafer is heated to a temperature as high as 400° C. in the oxide film modifying heat processing, the chemical oxide film reacts with the aluminum-silicon alloy film and turns into another substance, thereby reducing the thickness of the chemical oxide film. Thus, it is clearly preferable to set the temperature of the wafer not higher than 350° C. in the oxide film modifying heat processing. The reaction between the chemical oxide film and the aluminum-silicon alloy might involve reaction between aluminum and oxygen atoms in the chemical oxide film, thereby producing alumina.

Figure 6:
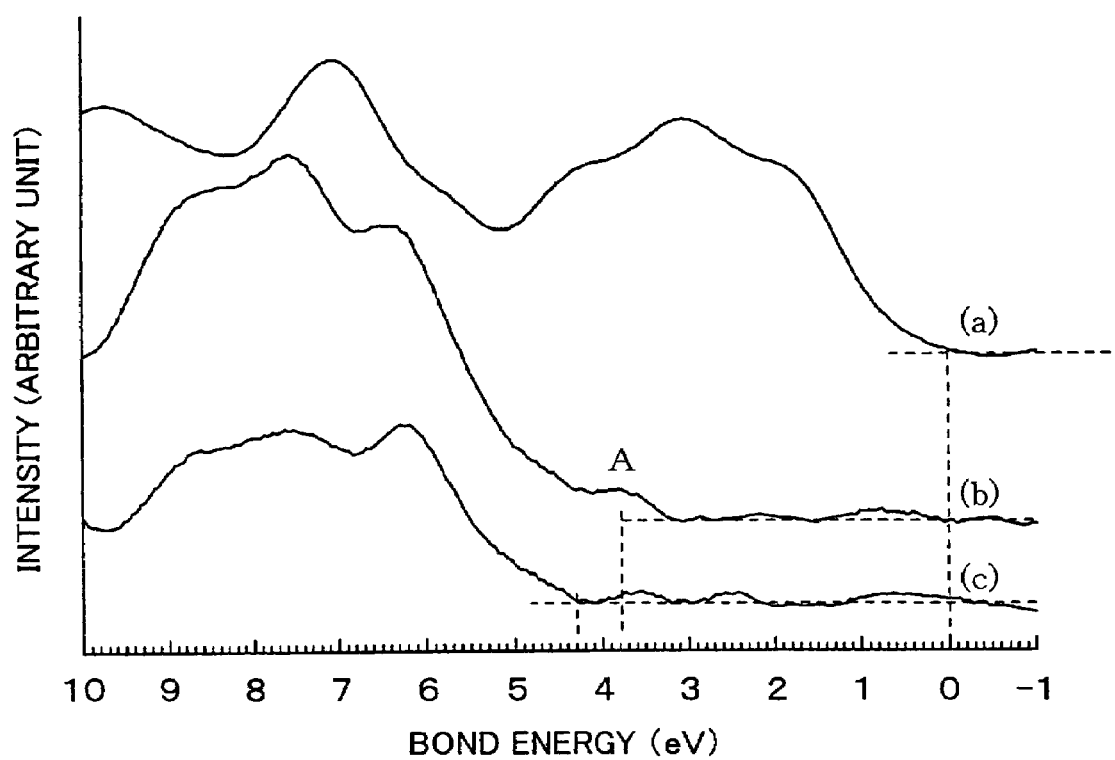
FIG. 6 is a graph illustrating valence band spectrums of a clean silicon substrate (a), a silicon substrate (b) (on which a silicon dioxide film is formed for the purpose of comparison), and a silicon substrate (c) (on which a silicon dioxide film is formed by the method of FIGS. 1(a) to 1(f)), measured by X-ray photoelectron method.

FIG. 6 is a graph illustrating valence band spectrums observed by X-ray photoelectric method. In FIG. 6, spectrum (a) is a spectrum of a clean silicon surface; spectrum (b) is a valence band spectrum observed after the chemical oxide film 5 was formed by the chemical oxide film formation processing; and spectrum (c) is a valence band spectrum observed after (i) the modified chemical oxide film 7 was formed by the chemical oxide film formation processing, metal film formation processing, and oxide film modifying heat processing, and (ii) the aluminum-silicon alloy film was removed by etching with hydrochloric acid. In order to show a valence band spectrum of only the chemical oxide film 5 or the modified chemical oxide film 7, spectrums (b) and (c) are shown as a result of subtraction of the spectrum of the clean silicon surface (spectrum (a)) from the spectrum of the chemical oxide film 5 or the modified chemical oxide film 7 on the silicon substrate 1.

From spectrum (b), it was found that the end of the valence band of the chemical oxide film 5 was at an energy position lower than that of the end of the silicon valence band by 3.8 eV. It was also found that there is a shoulder peak A in the vicinity of the end of the valence band of the chemical oxide film 5. It can be assumed that this shoulder peak A is caused by impurities such as OH. Therefore, the shoulder peak A indicates that the impurities have energy level in the vicinity of the end of the valence band in the band gap of the chemical oxide film 5.

From spectrum (c), it was found that the end of the valence band of the chemical oxide film, having been shifted to the low-energy side by about 0.5 eV through the oxide film modifying heat processing, was at an energy position lower than that of the end of the silicon valence band by 4.3 eV.

This experimental result shows that the band gap energy of the chemical oxide film increased through the oxide film modifying heat processing. Since there was no shoulder peak in the vicinity of the end of the valence band of the modified chemical oxide film 7, it was also found that the energy level in the band gap of the chemical oxide film disappeared through the oxide film modifying heat processing.

Figure 7:
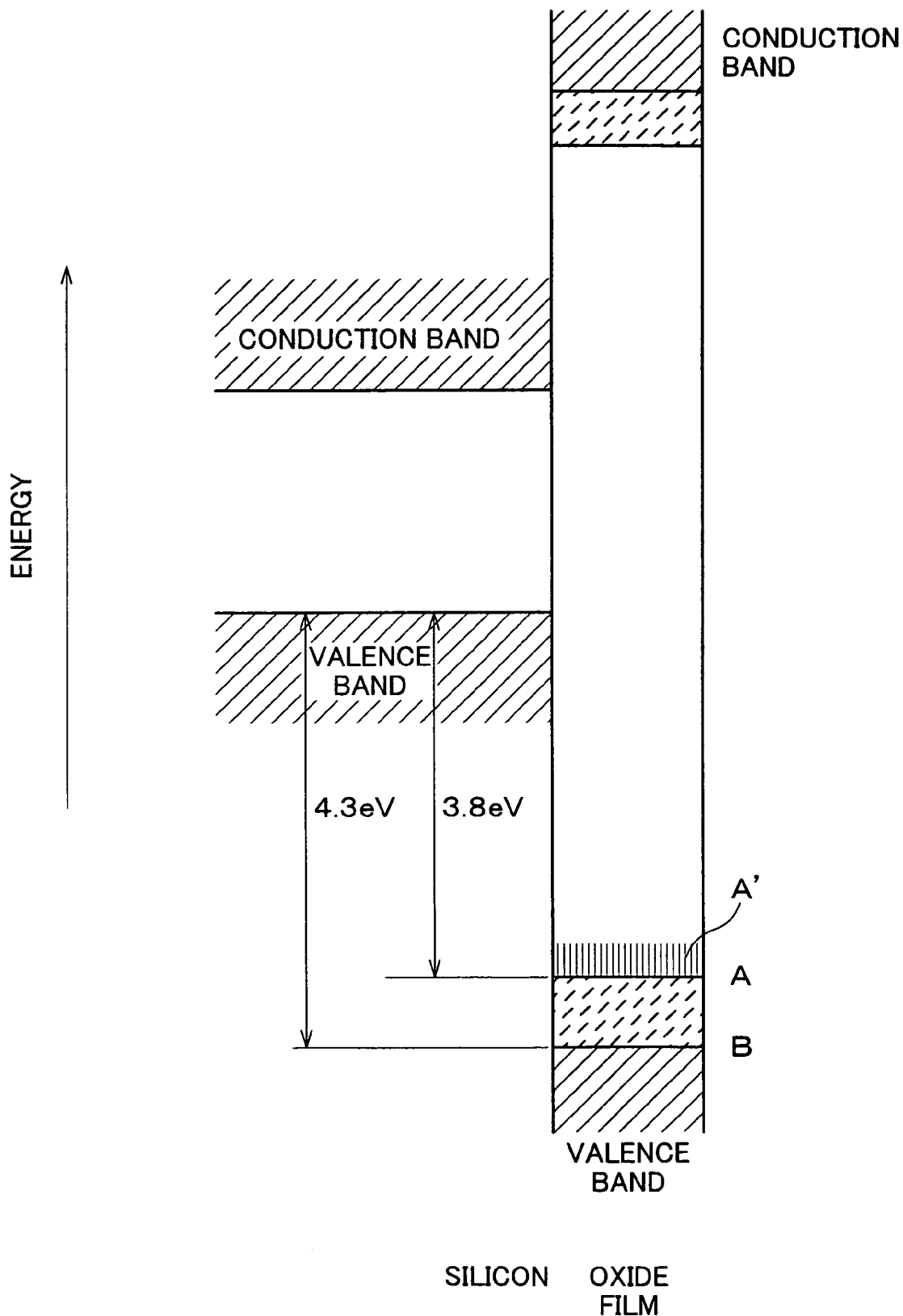
FIG. 7 is a band diagram illustrating an expected band state of a silicon dioxide film formed without performing the heat processing in the hydrogen-containing gas by the method of FIGS. 1(a) to 1(f) and of a silicon dioxide film formed by performing the heat processing.
Figure 8:
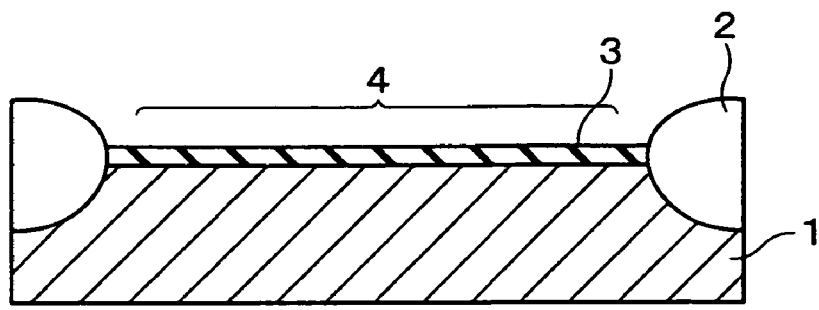
FIGS. 8(a) to 8(e) are cross-sectional views respectively illustrating steps in a method of forming a silicon dioxide film on a surface of a silicon substrate in accordance with a second embodiment of the present invention.
Figure 8:
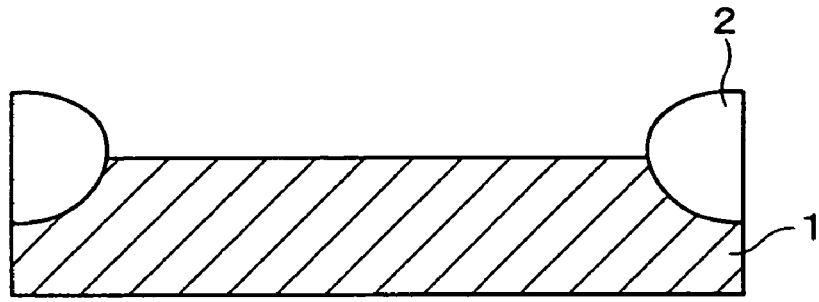
Figure 8:
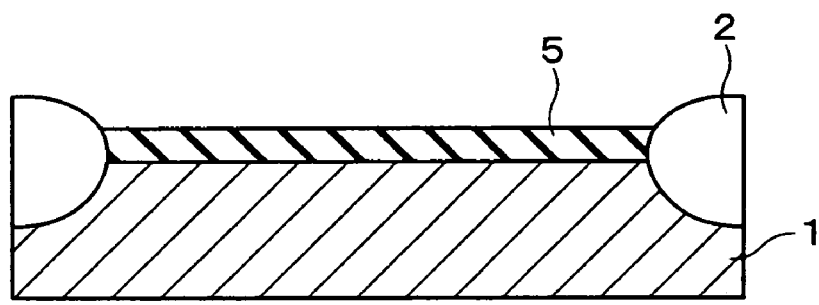
Figure 8:
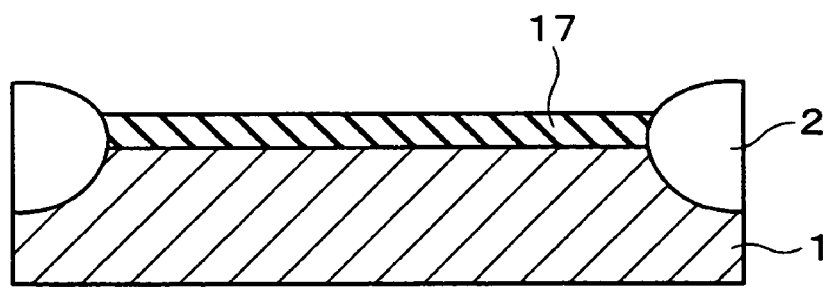
Figure 8:
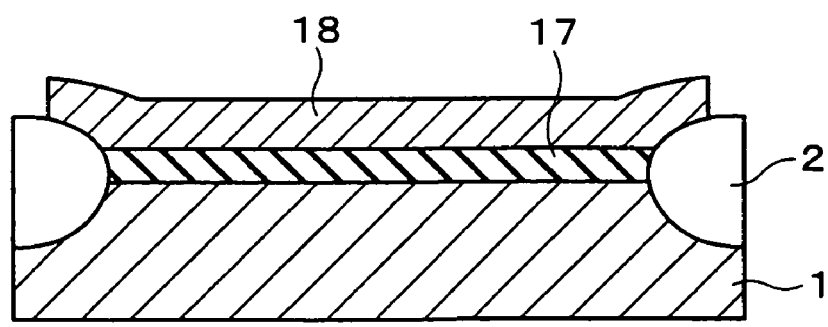

FIG. 7 is a band diagram illustrating an expected band state of the chemical oxide film. For the sake of simplicity, this band diagram is illustrated in a flat band state. If the oxide film modifying heat processing was not performed after the chemical oxide film 5 is formed, the valence band of the chemical oxide film 5 was at an energy position A, which was lower than that of the end of the silicon valence band by 3.8 eV. In the vicinity of the end A of the valence band of the chemical oxide film 5, there was energy state A' having a low state density.

On the other hand, if the metal film formation processing and oxide film modifying heat processing were performed after the formation of the chemical oxide film 5 in forming the modified chemical oxide film 7, the energy state A' disappeared. In addition, the end of the valence band of the modified chemical oxide film 7 shifted by 0.5 eV to the low-energy side of the end of the valence band of the chemical oxide film 5, thereby moving to an energy position B, which was lower than the end of the silicon valence band by 4.3 eV.

As described above, if the chemical oxide film 5 is formed by the chemical oxide film formation processing and metal film formation processing, and modified to the modified chemical oxide film 7 by the oxide film modifying heat processing, the leak current density of the chemical oxide film can be decreased. Although the cause of this decrease is still unknown at this time, the following describes what the inventors of the present invention consider as the most rational account.

It can be assumed that, if an oxide film is formed by oxidizing silicon at a low temperature with such substance as highly oxidative nitric acid, the stress at the interface is lower than in the case where thermal oxidation is performed at a high temperature. However, in a chemical oxide film, there are silicon dangling bond interface states due to unreacted silicon, and defect states due to impurities such as OH. Therefore, leak current flows through the interface states and/or defect states.

If the heat processing is performed in a hydrogen-containing gas, hydrogen is isolated on the surface of the metal film, and atomic hydrogen is injected into the chemical oxide film. The injected atomic hydrogen reacts with the interface states and/or defect states and thereby removes them. As a result, being unable to flow through the interface states and/or defect states, the leak current can flow only by the quantum mechanical tunnel mechanism. Moreover, since the heat processing in a hydrogen-containing gas increases the band gap energy of the chemical oxide film, the tunnel current that flows by the quantum mechanical tunnel mechanism also decreases. It can be assumed that the leak current density decreases as a result.

The extremely thin silicon dioxide film formed by the method of the present embodiment as described above can be used not only as an extremely thin gate oxide film of MOS transistors and MOS capacitors, but also for various other purposes. For example, it is possible to adopt the method of forming a silicon dioxide film in accordance with the present embodiment as a step of forming a silicon dioxide film on the surface of a silicon substrate in a method of manufacturing a semiconductor device. In this case, the metal film 6 may be patterned and used as a conductive layer of the electrode 8 or the like of the semiconductor device. Alternatively, the metal layer 6 may be removed completely, and the conductive layer may be formed separately.

In the present embodiment, the silicon dioxide film is formed on the silicon substrate. However, the present invention is also applicable to the case where the oxide film is formed on the surface of a semiconductor substrate other than the silicon substrate. Examples of the semiconductor substrate are silicon carbide (SiC) and silicon germanium (SiGe).

Specifically, a method of forming an oxide film on a surface of a semiconductor substrate in accordance with the present invention includes the steps of: forming an oxide film on a surface of a semiconductor substrate by supplying a drug solution to the surface of the semiconductor substrate; depositing a film containing metal atoms on the oxide film;

and heat-processing the semiconductor substrate, on which the film containing metal atoms is deposited, in a hydrogen-containing gas.

A method of forming an oxide film on a surface of a semiconductor substrate in accordance with the present invention includes the steps of: forming an oxide film on a surface of a semiconductor substrate by supplying vapor of a drug solution to the surface of the semiconductor substrate; depositing a film containing metal atoms on the oxide film; and heat-processing the semiconductor substrate, on which the film containing metal atoms is deposited, in a hydrogen-containing gas.

By these methods, a high-quality (with low leak current density), extremely thin oxide film can be formed on the surface of a semiconductor substrate. The method of forming an oxide film on a surface of a semiconductor substrate can be adopted as a step of forming an oxide film on a semiconductor substrate in a method of forming a semiconductor.

In these cases, the drug solution or the vapor of the drug solution can be a drug solution or vapor of a drag solution selected from the group consisting of nitric acid, sulfuric acid, ozonic water, hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitrohydrochloric acid, perchloric acid, and boiling water. It is preferable that the drug solution or the vapor of the drug solution can be a drug solution or vapor of a drug solution selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water.

The film containing metal atoms can be a film containing metal atoms selected from the group consisting of aluminum, magnesium, nickel, chrome, platinum, palladium, tungsten, titanium, and tantalum.

The hydrogen-containing gas can be hydrogen or a mixed gas of hydrogen and a gas selected from the group consisting of nitrogen, argon, neon, water vapor, and oxygen.

[Embodiment 2]

The following describes a second embodiment of the present invention, with reference to FIGS. 8(a) to 12.

Described below with reference to FIGS. 8(a) to 8(e) is a method of forming a silicon dioxide film on a silicon substrate in accordance with the present embodiment. In the present embodiment, the chemical oxide film 5 is formed on the silicon substrate 1 by the steps of FIGS. 8(a) to 8(c), which are respectively identical to FIGS. 1(a) to 1(c) of EMBODIMENT 1. The description on the FIGS. 1(a) to 1(c) of EMBODIMENT 1 is also applicable to the steps of FIGS. 8(a) to 8(c) of the present embodiment.

After the chemical oxide film 5 was formed, in the present embodiment, the metal film 6 was not formed, but the wafer was heated in a hydrogen-containing gas in an electric furnace. In the present embodiment, the wafer was heated in a mixed gas of hydrogen and nitrogen (nitrogen containing 5% of hydrogen) at 450° C. for 20 minutes.

This heat processing is performed to react hydrogen with interface states and defect states, and thereby cause them to disappear. In this way, the electric property of the chemical oxide film 5 is improved. Since the metal film 6 is not formed in the present embodiment, the hydrogen-dissolving effect of the metal film 6 of EMBODIMENT 1 cannot be attained. However, the reaction of hydrogen with the interface states and defect states can be accelerated by setting the temperature of the wafer in the heat processing higher than in the case of EMBODIMENT 1. The heat processing did not change the thickness of the chemical oxide film 5. As a result of the heat processing, a modified chemical oxide film 17 (hereinafter referred to as "modified oxide film" or "modified silicon dioxide film") was formed (FIG. 8(d)).

Examples of the hydrogen-containing gas used in the heat processing are hydrogen or a mixed gas of hydrogen and a gas selected from the group consisting of nitrogen, argon, neon, water vapor, and oxygen.

Therefore, other than in the mixed gas of hydrogen and nitrogen, the heat processing can also be performed, for example, in hydrogen, in a mixed gas of hydrogen and nitrogen, in a mixed gas of hydrogen and argon, in a mixed gas of hydrogen and neon, in a mixed gas of hydrogen and water vapor, and in a mixed gas of hydrogen and oxygen.

It is not necessary that the temperature of the wafer in the heat processing is 450° C. Substantially the same effect of improving the electric property of the chemical oxide film 5 is attained as long as the temperature of the wafer is within the range of 300° C. to 600° C. Likewise, it is not necessary that the period of heat processing is 20 minutes. Substantially the same effect of improving the electric property of the chemical oxide film 5 is attained as long as the period of heat processing is 1 minute to 120 minutes. If the period of heat processing is not shorter than 1 minute, the hydrogen diffuses the chemical oxide film 5, thereby modifying the chemical oxide film 5 effectively. In addition, if the period of heat processing is not longer than 120 minutes, the increase of device preparation time is unlikely to be a problem.

Thus, according to the present method, the chemical oxide film 5 can be modified through the heat processing in the hydrogen-containing gas. Therefore, it is not necessary to perform heat processing in an oxidizing atmosphere. As a result, the thickness of the chemical oxide film does not increase easily, that is, excellent film-thickness controllability is attained.

Furthermore, the heat processing in the hydrogen-containing gas is effective even at a relatively low temperature. Therefore, the thickness of the chemical oxide film does not increase easily even if oxygen or the like is mixed in, that is, excellent film-thickness controllability is attained.

In order to increase the film thickness intentionally, the hydrogen-containing gas may be a mixed gas of hydrogen and water vapor, a mixed solution of hydrogen and oxygen, or the like.

Then, a metal film was formed on the modified chemical oxide film 17 and the isolation region 2. Subsequently, a patterned resist film is formed on the metal film by a known photography technology. By a known dry etching technology, the metal film is etched and patterned to provide an electrode 18. In this way, an MOS diode is formed (FIG. 8(e)).

Described next are properties of the modified chemical oxide film 17 formed by the foregoing method. Unless otherwise noted, in the present embodiment, the term "chemical oxide film formation processing" refers to the processing for forming the chemical oxide film 5 by soaking the wafer (finished with such processing as removal of natural oxide film and cleaning) for 30 minutes in 68%-by-weight azeotropic nitric acid heated to the azeotropic temperature of 120.7° C. (processing of FIGS. 8(a) to 8(c)), as in EMBODIMENT 1; and the term "oxide film modifying heat processing" refers to the processing of introducing the wafer after the chemical oxide film formation processing into the electric furnace and heating the wafer in nitrogen (which contains 5% of hydrogen) at 450° C. for 20 minutes (processing of FIG. 8(d)).

Figure 9:
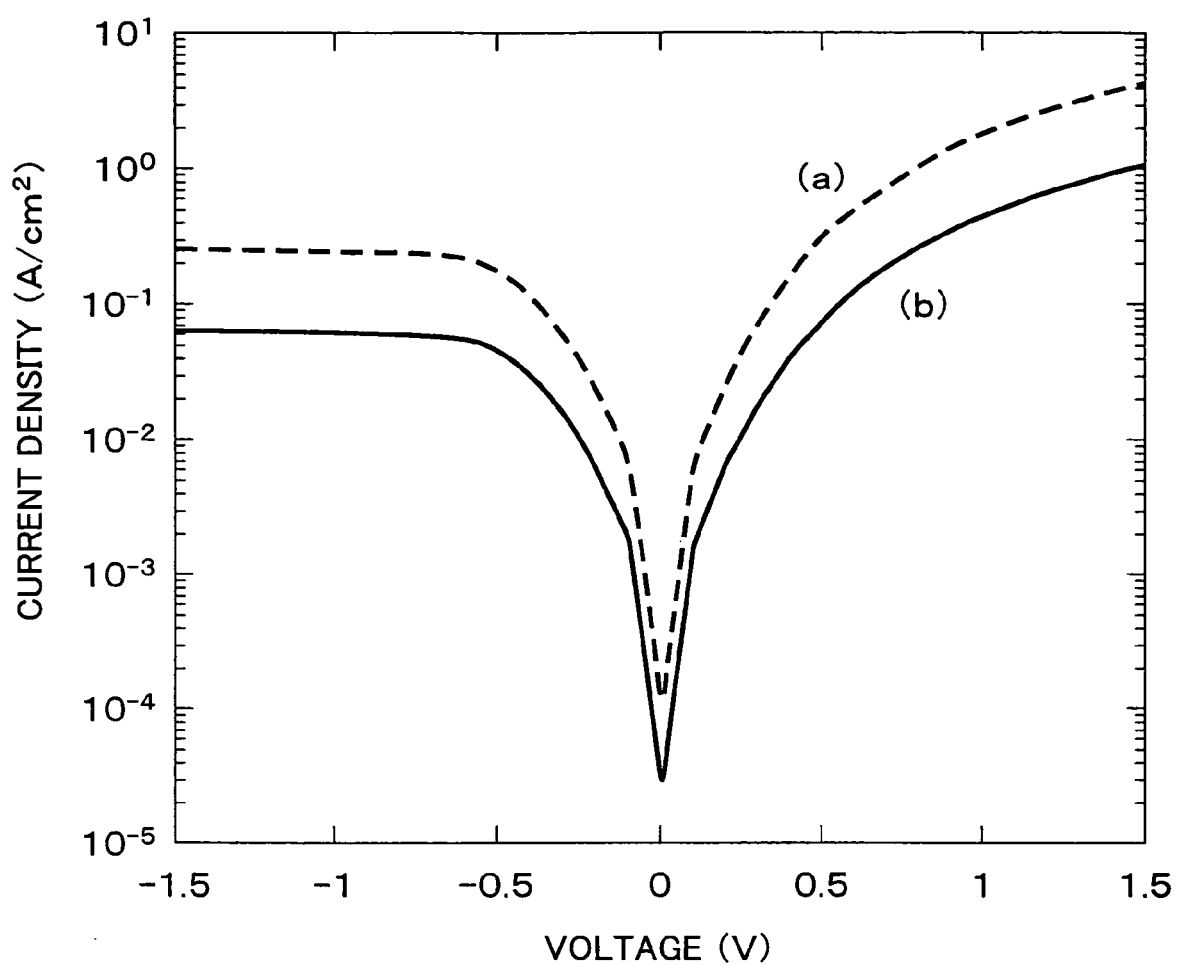
FIG. 9 is a graph illustrating the relationship between applied voltage and leak current density, with respect to a silicon dioxide film (a) (formed for the purpose of comparison) and a silicon dioxide film (b) (formed by the method of FIGS. 8(a) to 8(e)).

Like FIG. 2 of EMBODIMENT 1, FIG. 9 is a graph illustrating the relationship between the applied voltage and the leak current density (measurement result) of the leak current flowing in the chemical oxide film. In FIG. 9, plot (a) is identical to the plot (a) in FIG. 2 of EMBODIMENT 1, and indicates a leak current in the MOS diode formed by providing the metal film 6 on the chemical oxide film 5 that was formed without performing the oxide film modifying heat processing. Plot (b) indicates a leak current of the MOS diode formed by performing oxide film modifying processing of the present embodiment after the chemical oxide film formation processing.

From the comparison of the plot (a) and plot (b), it was found that the leak current density decreased drastically if the oxide film modifying heat processing of the present embodiment was performed after the chemical oxide film formation processing. When the applied voltage was 1 V, the leak current density was about 0.5 A/cm$^2$. This current density was lower than that of the oxide film formed by high-temperature oxidization.

Figure 10:
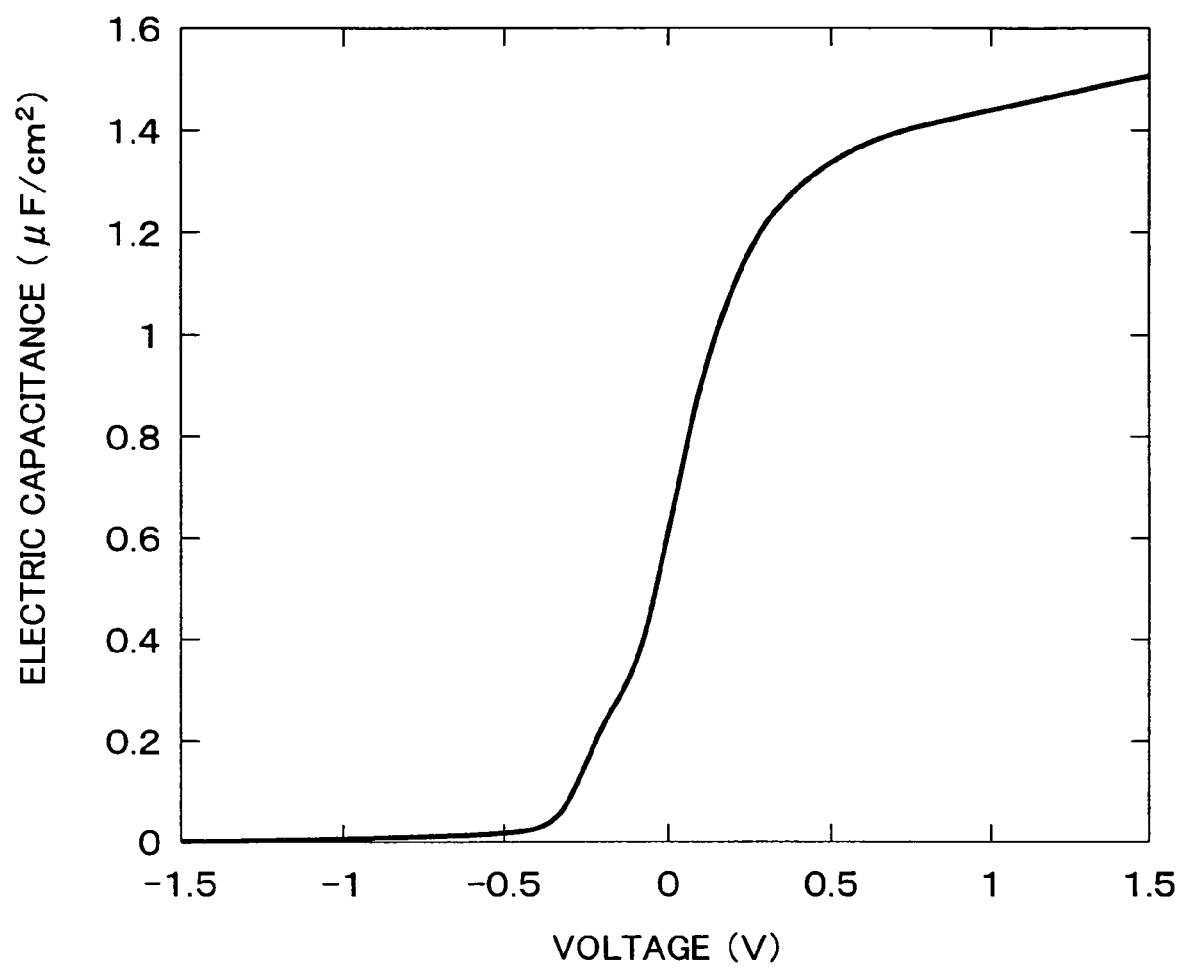
FIG. 10 is a graph illustrating the relationship between applied voltage and electric capacitance, with respect to a silicon dioxide film formed by the method of FIGS. 8(a) to 8(e).

FIG. 10 is a graph (C-V curve) illustrating the relationship between the applied voltage and the electric capacitance of the MOS diode formed by performing the oxide film modifying heat processing of the present embodiment after the chemical oxide film formation processing. Like the curve (b) in FIG. 3 of EMBODIMENT 1, the C-V curve of FIG. 10 did not have a shoulder that appeared in the case where the chemical oxide film 5 was formed without performing the oxide film modifying heat processing. This indicates that the defect states and interface states disappeared as a result of the oxide film modifying heat processing of the present embodiment.

Figure 11:
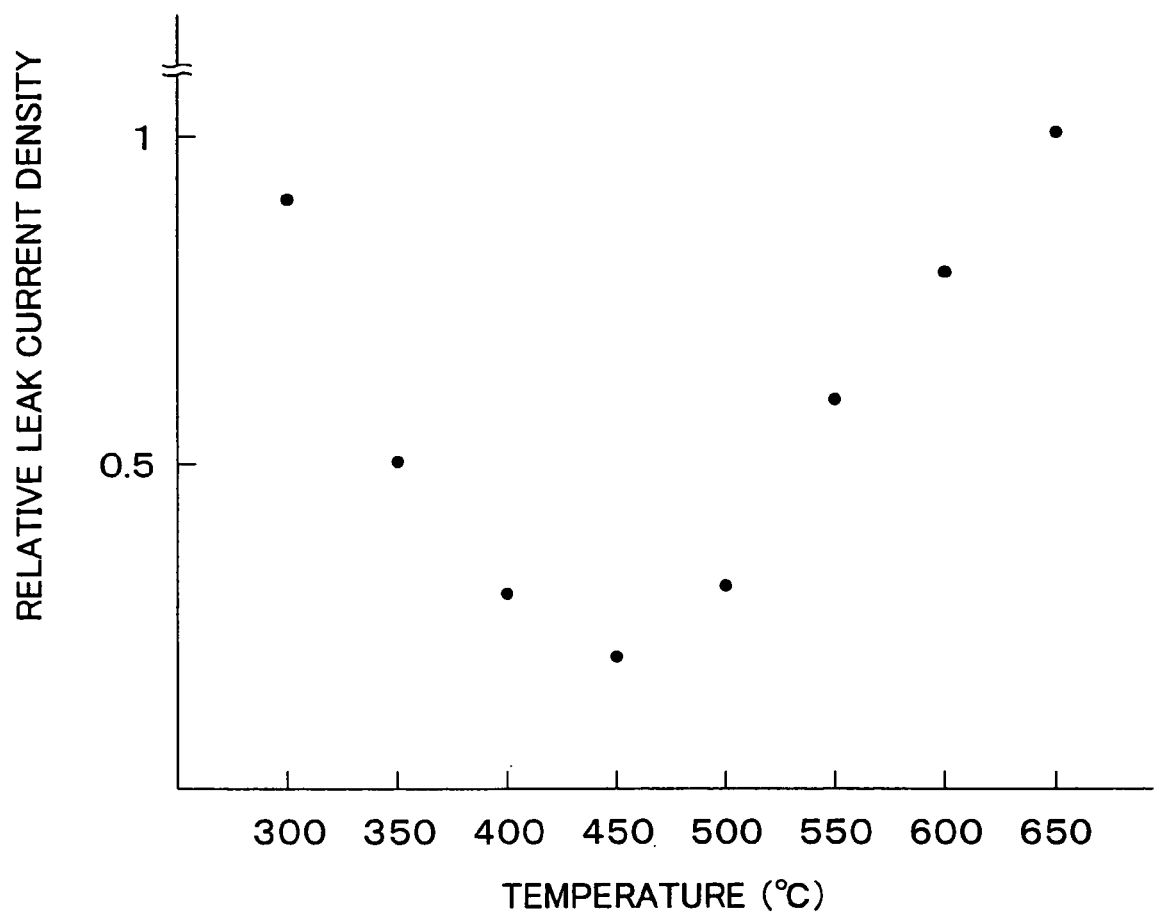
FIG. 11 is a graph illustrating changes of the leak current density of the silicon dioxide film formed at different temperatures of heat processing in a hydrogen-containing gas by the method of FIGS. 8(a) to 8(e).

FIG. 11 is a graph illustrating changes of the leak current density of the MOS diode formed by the chemical oxide film formation processing and oxide film modifying heat processing, the changes being caused by changing the temperature of the wafer in the oxide film modifying heat processing. The result of FIG. 11 is about the leak current density of the case where the applied voltage is 1V, and indicates relative values of the leak current density (relative leak current density) on the assumption that the leak current density is 1 if the oxide film modifying heat processing is not performed.

From FIG. 11, it was found that the leak current density decreases not only when the temperature of the wafer in the oxide film modifying heat processing was 450° C., but also when the temperature of the wafer was within the range of 300° C. to 600° C. It was also found that, if the temperature of the wafer was within the range of 350° C. to 500° C., the electric property of the modified chemical oxide film 17 improved drastically, because the leak current density decreased to be not higher than 50% of the case where the oxide film modifying heat processing was not performed.

If the temperature of the wafer in the oxide film modifying heat processing was 500° C. to 600° C., the defect states and interface states did not disappear effectively. As a result, the leak current decreased only by a small amount. On the other hand, if the temperature of the wafer in the oxide film modifying heat processing was 350° C. to 500° C., the defect states and interface states disappeared effectively. As a result, the leak current decreased drastically.

Figure 12:
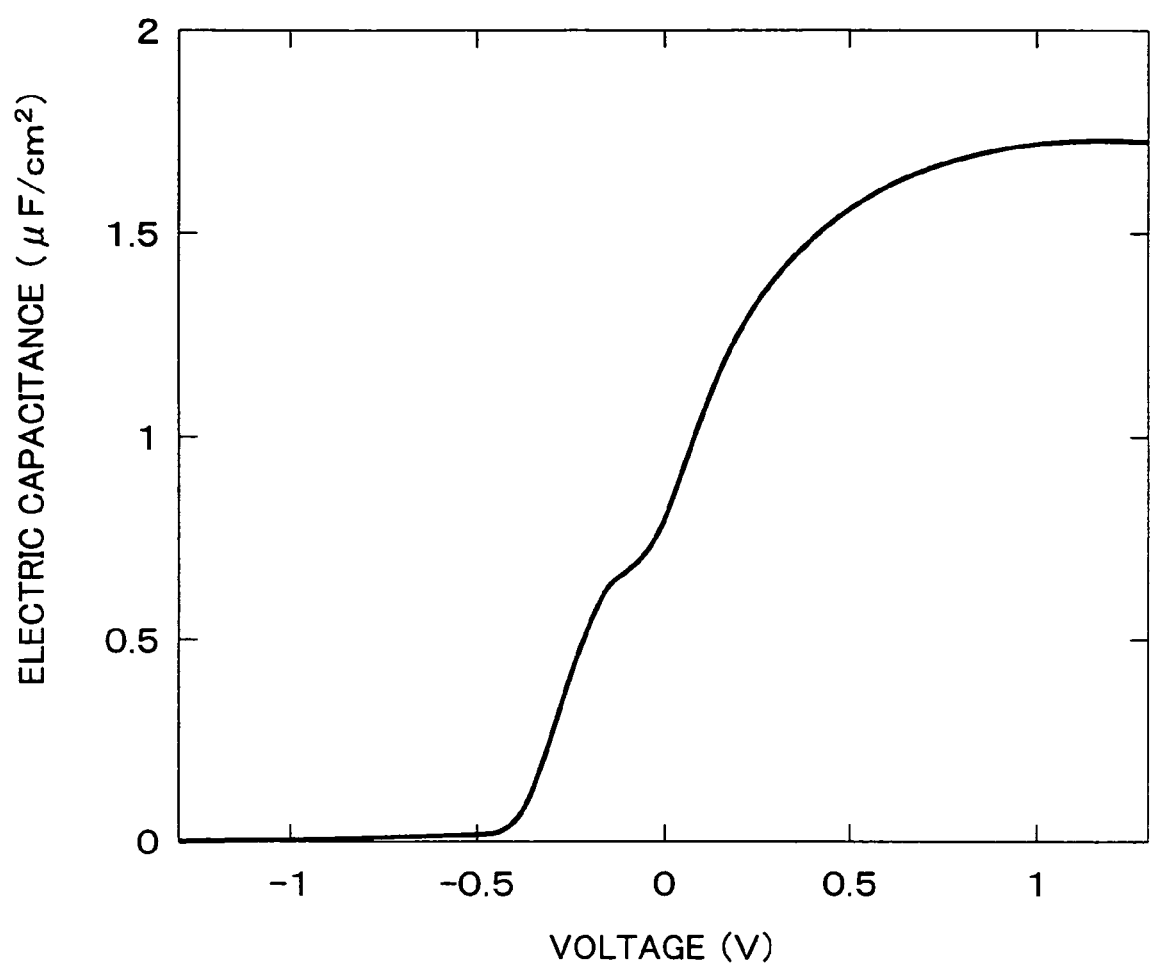
FIG. 12 is a graph illustrating the relationship between applied voltage and electric capacitance, with respect to a silicon dioxide film formed by the method of FIGS. 8(a) to 8(e) except that the temperature of the heat processing in the hydrogen-containing gas is changed to 600° C.

FIG. 12 is a C-V curve illustrating the relationship between the applied voltage and the electric capacitance of the MOS diode formed by performing the oxide film modifying heat processing by heating the wafer to a newly set temperature of 600° C. after the chemical oxide film formation processing. Like the curve (a) in FIG. 3 of EMBODIMENT 1, the C-V curve of FIG. 12 had a shoulder that appeared in the case where the chemical oxide film 5 was formed without performing the oxide film modifying heat processing. This indicates that the defect states and interface states do not disappear effectively through the high-temperature heat processing at 600° C.

As a result of experiments in which the oxide film modifying heat processing was performed by heating the wafer to various other temperatures, a shoulder appeared on the C-V curve if the temperature of the wafer was not lower than 530° C. Therefore, it was found that the defect states and interface states did not disappear effectively if the temperature of the wafer was not lower than 530° C. These results show that the oxide film modifying heat processing is required to be performed at a temperature of not higher than 500° C.

In the method of patent publication 1 described in BACKGROUND ART, after the oxide film is formed, the oxide film is modified by heating in an inactive gas such as nitrogen. In this case, the interface states disappear when the stress on the interface of silicon/oxide film is mitigated through heat processing at a high temperature. Therefore, in general, a high temperature of about 900° C. is required.

In contrast, according to the method of the present embodiment, the oxide film modifying heat processing is performed in an atmosphere of hydrogen. This causes hydrogen to react with the interface states and defect states and thereby form Si—H bonds. As a result, the interface states and defect states disappear. In this case, if the temperature of the oxide film modifying heat processing is lower than 350° C., it is difficult to form the Si—H bonds by reacting the hydrogen with the interface states and defect states. If, on the other hand, the temperature of the oxide film modifying heat processing is higher than 500° C., the Si—H bonds split up even if they are successfully formed, and the interface states and defect states are generated again. Therefore, in order to cause disappearance of the interface states and defect states effectively, it is preferable to set the temperature of the oxide film modifying heat processing to 350° C. to 500° C.

Figure 13:
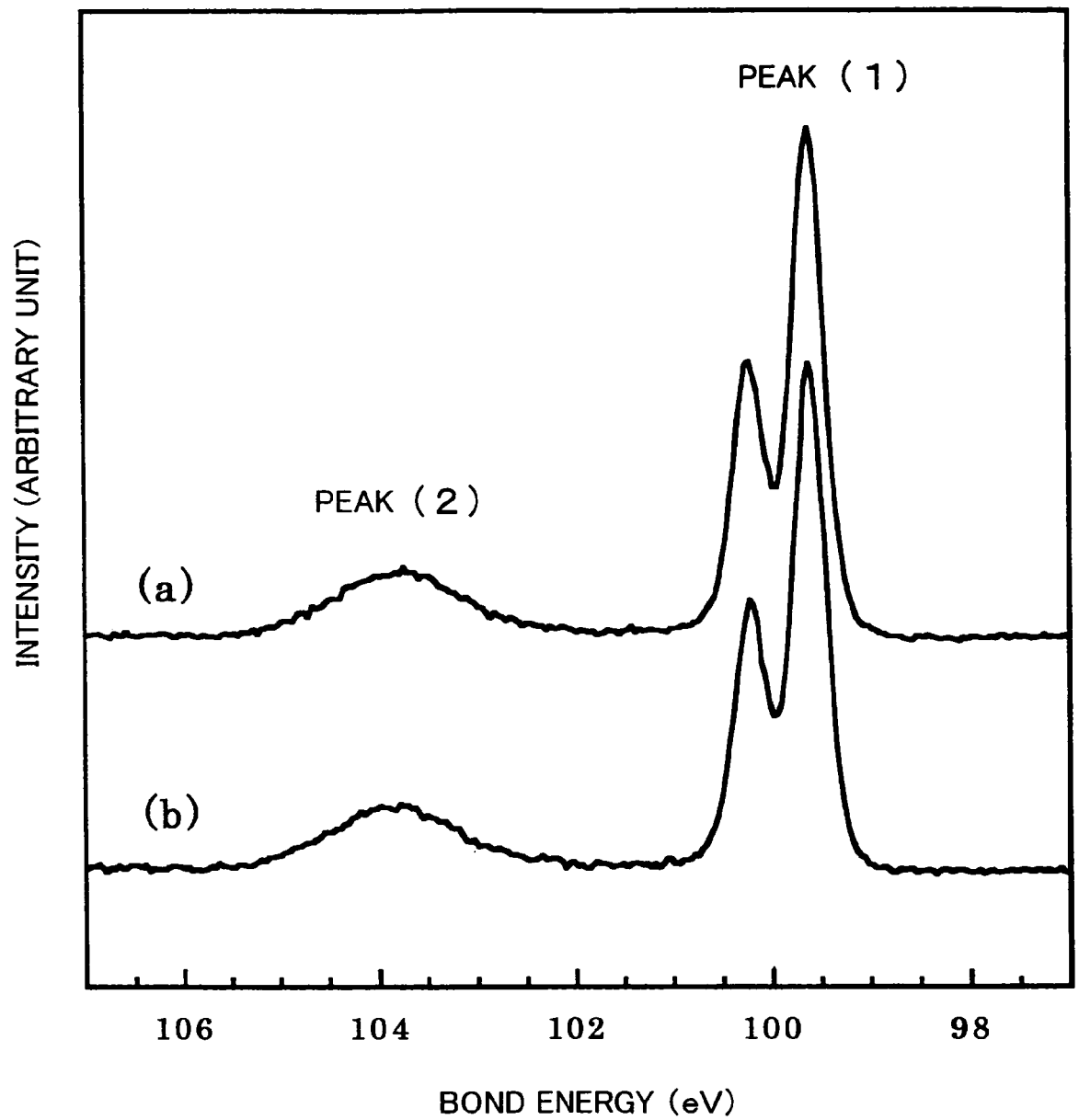
FIG. 13 is a graph illustrating X-ray photoelectron spectrums from the 2p orbit of silicon atoms in a silicon dioxide film (a) (formed for the purpose of comparison) and a silicon dioxide film (b) (formed by the method of FIGS. 8(a) to 8(e)).

FIG. 13 is a graph illustrating X-ray photoelectron spectrums from the 2p orbit of silicon atoms of the chemical oxide film formed on the silicon substrate 1. In FIG. 13, spectrum (a) is an X-ray photoelectron spectrum observed after the chemical oxide film 5 was formed by the chemical oxide film formation processing; spectrum (b) is an X-ray photoelectron spectrum observed after (i) the chemical oxide film formation processing was performed, and (ii) the oxide film modifying heat processing was performed in a mixed gas of hydrogen and nitrogen (nitrogen that contains 5% of hydrogen) at 450° C. for 20 minutes.

The peak (1) in FIG. 13 is caused by the photoelectrons from the 2p orbit of silicon atoms of the silicon substrate 1. The peak (2) in FIG. 13 is caused by photoelectrons from the 2p orbit of the silicon atoms of the chemical oxide film 5 or the modified chemical oxide film 17. Based on the ratio of the area intensity at the peak (2) with respect to the area intensity at the peak (1), the thickness of the chemical oxide film 5 and the modified chemical oxide film 17 was calculated. The calculation method was the same as the method employed in EMBODIMENT 1.

The thickness of the chemical oxide film 5 was calculated as 1.4 nm in the case where the oxide film modifying heat processing was not performed after the formation of the chemical oxide film (the case corresponding to spectrum (a)). The thickness of the modified chemical oxide film 17 was also calculated as 1.4 nm in the case where the oxide film modifying heat processing was performed after the formation of the chemical oxide film (the case corresponds to spectrum (b)). From this experimental result, it was found that the oxide film hardly grew through the oxide film modifying heat processing at 450° C. Though similar experiments, it was found that the thickness of the modified chemical oxide film 17 hardly increased even if the temperature of the oxide film modifying heat processing was changed within the temperature range of 300° C. to 600° C.

The extremely thin silicon dioxide film formed by the method of the present embodiment as described above can be used not only as an extremely thin gate oxide film of MOS transistors and MOS capacitors, but also for various other purposes. For example, it is possible to adopt the method of forming a silicon dioxide film in accordance with the present embodiment as a step of forming a silicon dioxide film on the surface of a silicon substrate in a method of manufacturing a semiconductor device.

[Embodiment 3]

Figure 14:
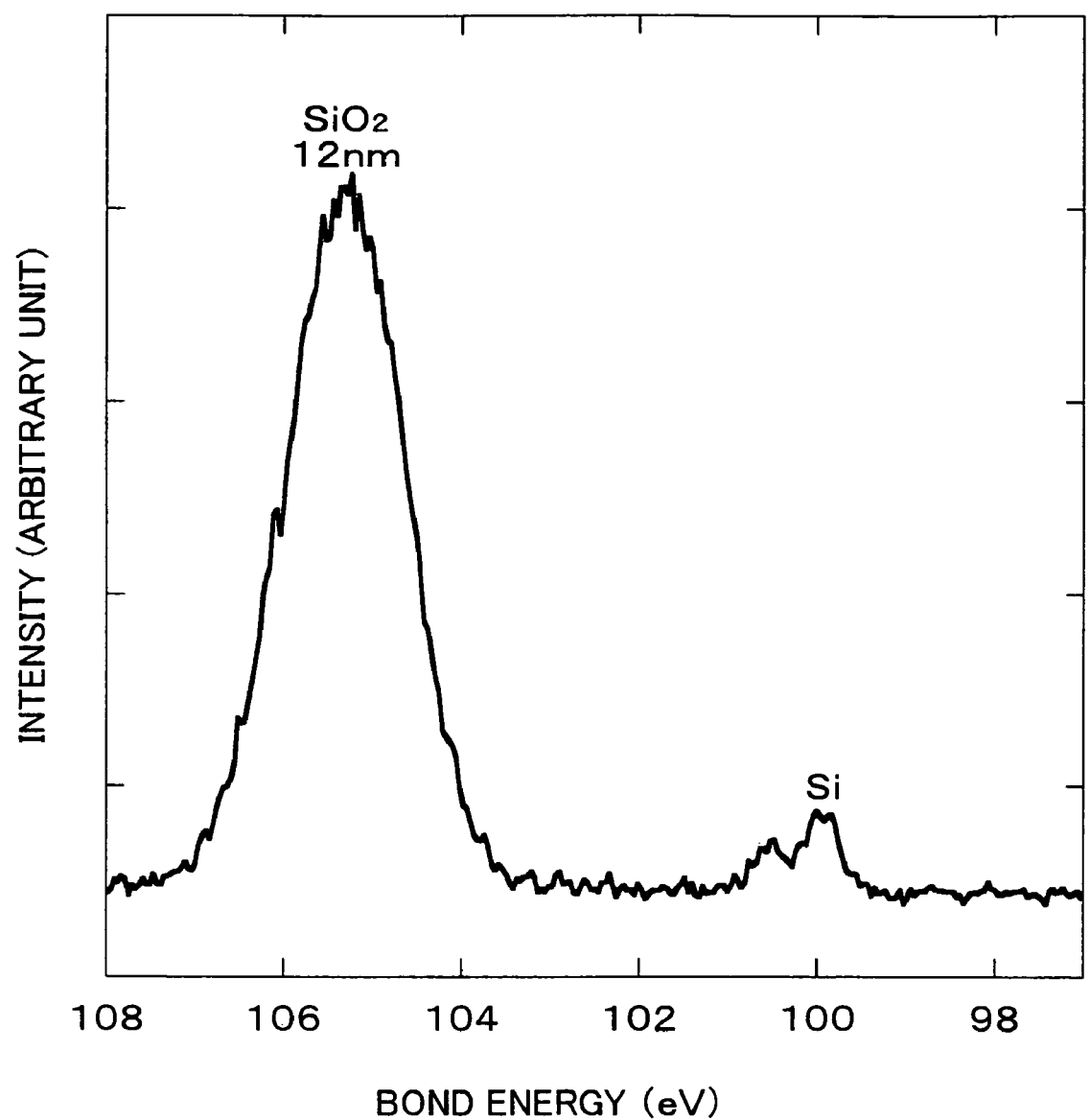
FIG. 14 is a graph illustrating an X-ray photoelectron spectrum from the 2p orbit of silicon atoms in a silicon dioxide film formed by a third embodiment of the present invention.

The following describes a third embodiment of the present invention, with reference to FIG. 14.

In order to manufacture a flexible liquid crystal display, which has been under development recently, it is necessary to form TFTs on a substrate made of organic substance such as PET. For this purpose, the TFTs must be formed at a low temperature of not higher than 200° C.

In the case of such TFTs, in general, a relatively high voltage is applied to the gate electrode. Therefore, a silicon dioxide film used as the gate oxide film of the TFTs must have a sufficient thickness so as to avoid dielectric breakdown.

Conventionally, the silicon dioxide film used as the gate insulating film of the TFTs has been formed through deposition by CVD. However, in order to deposit the silicon dioxide film by CVD, the substrate must be heated to a high temperature of 400° C. to 500° C. Therefore, depositing the silicon dioxide film by CVD is not suitable for forming the TFTs in manufacturing a flexible liquid crystal display.

In order to form the oxide film at a low temperature of not higher than 200° C., the method of forming a chemical oxide film by means of exposure to vapor of a drug solution described in EMBODIMENT 1 can be employed suitably.

Specifically, by exposing a PET substrate provided with a silicon film on the surface thereof to vapor of a drug solution, and heating the PET substrate, the chemical oxide film (silicon dioxide film) can be formed on the surface of the silicon film.

The vapor of a drug solution can be a vapor of a drug solution selected from the group consisting of nitric acid sulfuric acid, ozonic water (water in which several dozen ppm of ozone is dissolved), hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitrohydrochloric acid, perchloric acid, and water.

Among these, it is preferable to use vapor of strong acid such as nitric acid, sulfuric acid, and perchloric acid. By using the vapor of strong acid, it is possible to oxidize the silicon film at a low temperature of not higher than 200° C., and thereby easily form a chemical oxide film having a thickness of not less than 2 nm.

It is preferable that the vapor of a drug solution is vapor of a drug solution selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water. In an azeotropic state, the concentration of the vapor of the drug solution does not easily change with time. Therefore, the thickness of the chemical oxide film to be formed can be controlled with excellent reproducibility. This is why the vapor of the foregoing drug solutions is preferable.

It is preferable that the substrate temperature is within the range of 50° C. to 200° C. when the PET substrate provided with the silicon film on the surface thereof is exposed to the vapor of a drug solution. If the substrate temperature is not lower than 50° C., oxidization is accelerated effectively. Therefore, it is possible to effectively form a chemical oxide film 5 having a thickness of not less than 1 nm (if the substrate temperature is lower than 50° C., it is difficult to form a chemical oxide film 5 having a thickness of not less than 1 nm). The substrate temperature is not higher than 200° C. in order to prevent modification and the like of the PET substrate.

The properties of the chemical oxide film formed by the foregoing method are described below. In checking the properties of the chemical oxide film, it does not matter whether the chemical oxide film is a silicon film formed on a PET substrate or a silicon film formed on a silicon substrate. Therefore, in this case, a silicon substrate having a silicon film on its surface is used instead of the PET substrate having a silicon film on its surface.

FIG. 14 is a graph illustrating the X-ray photoelectron spectrum from the 2p orbit of silicon atoms measured after (1) the chemical oxide film was formed by heating the silicon substrate (cleaned as in EMBODIMENT 1) to 150° C., and (2) the silicon substrate was exposed to vapor of azeotropic nitric acid for 30 minutes. The large intensity peak in FIG. 14 is caused by the photoelectrons from the 2p orbit of silicon atoms of the chemical oxide film; the two weak peaks are caused by the silicon substrate.

Based on the ratio of the intensities at these peaks, the thickness of the chemical oxide film on the silicon substrate was calculated as 12 nm. By thus using the vapor of a drug solution, it is possible to form the chemical oxide film on the silicon substrate at a low temperature of 150° C. In addition, by using the vapor of strong acid, it is possible to oxidize the silicon film at a low temperature of 200° C. and thereby easily form a chemical oxide film having a thickness of not less than 2 nm, or even not less than 10 nm.

The method of forming a chemical oxide film in accordance with the present embodiment is particularly suitable for forming the gate oxide film of the TFTs of a flexible liquid crystal display. In addition, the method is also suitable for forming a chemical oxide film that is required to be formed at a low temperature.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention relates to a method of forming a silicon dioxide film on a surface of a silicon substrate and a method of forming an oxide film on a surface of a semiconductor substrate, and a method of manufacturing a semiconductor device by these methods. These methods can be employed to form an oxide film of an MOS (metal-oxide-semiconductor) device used for semiconductor integrated circuits, especially to form an extremely thin gate oxide film, a capacitor oxide film, and the like of an MOS transistor, an MOS capacitor, and the like. In particular, the present invention relates to a method of forming a high-quality (with little leak current), extremely thin silicon dioxide film and the like with excellent film-thickness controllability.

The present invention also relates to a method of forming, for example, a silicon dioxide film of a TFT (thin-film transistor) at a low temperature.

The invention claimed is:

1. A method of forming an oxide film on a surface of a silicon substrate, comprising the steps of:
   forming an oxide film on a surface of a silicon substrate by supplying a drug solution or vapor of a drug solution to the surface of the silicon substrate;
   depositing a film containing metal atoms on the oxide film; and
   heat-processing the silicon substrate, on which the film containing metal atoms is deposited, the heat processing being conducted at a temperature of 100° C. to 250° C. in an atmosphere of hydrogen gas.

2. A method of forming an oxide film on a sufface of a silicon substrate, comprising the steps of:
   forming an oxide film on a surface of a silicon substrate by supplying a drug solution or vapor of a drug solution to the surface of the silicon substrate; and
   heat-processing the silicon substrate, on which the oxide film is deposited, the heat processing being conducted at a temperature of 350° C. to 500° C. in an atmosphere of hydrogen gas, without depositing a film containing metal atoms on the oxide film.

3. The method as set forth in claim 1, wherein:
   the drug solution is selected from the group consisting of nitric acid, sulfuric acid, ozonic water, hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitro-hydrochloric acid, perchloric acid, and boiling water.

4. The method as set forth in claim 1, wherein:
   the drug solution is selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water.

5. The method as set forth in claim 1, wherein:
   the film containing metal atoms is a film containing metal atoms selected from the group consisting of aluminum, magnesium, nickel, chrome, platinum, palladium, tungsten, titanium, and tantalum.

6. The method as set forth in claim 1, wherein:
   the atmosphere of hydrogen gas is hydrogen or a mixed gas of hydrogen and a gas selected from the group consisting of nitrogen, argon, neon, water vapor, and oxygen.

7. The method as set forth in claim 6, wherein:
   the heat processing in the atmosphere of hydrogen gas is conducted for a period within a range of 1 minute to 120 minutes.

8. The method as set forth in claim 1, wherein:
   a natural oxide film or impurities existing on the surface of the silicon substrate are removed before forming the oxide film on the surface of the silicon substrate.

9. The method as set forth in claim 1, wherein:
   the silicon substrate is heated in supplying the vapor of a drug solution to the surface of the silicon substrate.

10. The method as set forth in claim 9, wherein:
    a temperature of the silicon substrate heated in supplying the vapor of a drug solution to the surface of the silicon substrate is within a range of 50° C. to 500° C.

11. A method of manufacturing a semiconductor device, comprising the step of:
    forming an oxide film on a surface of a silicon substrate by the method as set forth in claim 1.

12. The method as set forth in claim 2, wherein:
    the drug solution is selected from the group consisting of nitric acid, sulfuric acid, ozonic water, hydrogen peroxide solution, mixed solution of hydrochloric acid and hydrogen peroxide solution, mixed solution of sulfuric acid and hydrogen peroxide solution, mixed solution of aqueous ammonia and hydrogen peroxide solution, mixed solution of sulfuric acid and nitric acid, nitro-hydrochloric acid, perchloric acid, and boiling water.

13. The method as set forth in claim 2, wherein:
    the drug solution is selected from the group consisting of azeotropic nitric acid that is an azeotropic mixture of nitric acid and water, azeotropic sulfuric acid that is an azeotropic mixture of sulfuric acid and water, and azeotropic perchloric acid that is an azeotropic mixture of perchloric acid and water.

14. The method as set forth in any one of claim 2, wherein:
    the film containing metal atoms is a film containing metal atoms selected from the group consisting of aluminum, magnesium, nickel, chrome, platinum, palladium, tungsten, titanium, and tantalum.

15. The method as set forth in claim 2, wherein:
    the atmosphere of hydrogen gas is hydrogen or a mixed gas of hydrogen and a gas selected from the group consisting of nitrogen, argon, neon, water vapor, and oxygen.

16. The method as set forth in claim 15, wherein:
    the heat processing in the atmosphere of hydrogen gas is conducted for a period within a range of 1 minute to 120 minutes.

17. The method as set forth in claim 2, wherein:
    a natural oxide film or impurities existing on the surface of the silicon substrate are removed before forming the oxide film on the surface of the silicon substrate.

18. The method as set forth in claim 2, wherein:
    the silicon substrate is heated in supplying the vapor of a drug solution to the surface of the silicon substrate.

19. The method as set forth in claim 18, wherein:
    a temperature of the silicon substrate heated in supplying the vapor of a drug solution to the surface of the silicon substrate is within a range of 50° C. to 500° C.

20. A method of manufacturing a semiconductor device, comprising the step of:
    forming an oxide film on a surface of a silicon substrate by the method as set forth in claim 2.

* * * * *